(12) United States Patent
Cheng et al.

(10) Patent No.: US 12,405,731 B2
(45) Date of Patent: Sep. 2, 2025

(54) DATA WRITING METHODS, MEMORY STORAGE DEVICE AND MEMORY CONTROL CIRCUIT UNIT

(71) Applicant: PHISON ELECTRONICS CORP., Miaoli (TW)

(72) Inventors: Chun Teng Cheng, Miaoli County (TW); Jia-Fan Chien, Taichung (TW); Yu-Cheng Hsu, Yilan County (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 18/583,871

(22) Filed: Feb. 22, 2024

(65) Prior Publication Data

US 2025/0199693 A1 Jun. 19, 2025

(30) Foreign Application Priority Data

Dec. 19, 2023 (TW) .................. 112149501

(51) Int. Cl.
*G06F 12/00* (2006.01)
*G06F 3/06* (2006.01)
*G06F 12/1009* (2016.01)

(52) U.S. Cl.
CPC .......... *G06F 3/0619* (2013.01); *G06F 3/0659* (2013.01); *G06F 3/0679* (2013.01); *G06F 12/1009* (2013.01)

(58) Field of Classification Search
USPC ....................................................... 711/103
See application file for complete search history.

(56) References Cited

U.S. PATENT DOCUMENTS

| 2015/0036430 A1* | 2/2015 | Sukegawa | G06F 3/0604 365/185.11 |
| 2022/0189559 A1* | 6/2022 | Chen | G11C 7/1057 |

\* cited by examiner

*Primary Examiner* — Mohamed M Gebril
(74) *Attorney, Agent, or Firm* — JCIPRNET

(57) ABSTRACT

A method of writing data, including: obtaining a write instruction; writing a first data of write data to a target physical unit in a target word line of a plurality of word lines in accordance with the write instruction; after writing the first data, when the target word line has one or more empty physical units arranged after the target physical unit, selecting one or more further target physical unit respectively located in one or more further target word lines; and writing second data connected after the first data in the write data to the selected further target physical units, wherein the one or more further target word lines are arranged after the target word line.

39 Claims, 15 Drawing Sheets

Conventional method (data amount ratio of parity check data is 7:1 )

The provided embodiment (data amount ratio of parity check data is 7:1 )

| | String1 | String2 | String3 | String4 |
|---|---|---|---|---|
| WL1 | "1" | PU11 | | |
| WL2 | "1" | PU21 | | |
| WL3 | "1" | PU31 | | |
| WL4 | "1" | PU41 | | |
| WL5 | "1" | PU51 | | |
| WL6 | "1" | PU61 | | |
| WL7 | "1" | PU71 | | |
| WL8 | PRT1 | PU81 | | |

DATA WRITING METHODS, MEMORY STORAGE DEVICE AND MEMORY CONTROL CIRCUIT UNIT

CROSS-REFERENCE TO RELATED APPLICATION

This application claims the priority benefit of Taiwan application serial no. 112149501, filed on 19 Dec. 2023. The entirety of the above-mentioned patent application is hereby incorporated by reference herein and made a part of this specification.

BACKGROUND

Technical Field

The present invention relates to a data writing method and, in particular, to a data writing method for a rewritable non-volatile memory module, a memory storage device, and a memory control circuit unit.

Description of Related Art

Traditionally, when writing data to a rewritable non-volatile memory module, the write sequence used has a specific pattern. In other words, multiple physical units in the same word line are written sequentially according to the order of the string set. If all the physical units of a word line are full or no more data can be written, the next blank word line will be selected for subsequent data writing.

SUMMARY

The present invention provides a data writing method, a memory storage device, and a memory control circuit unit that provide a novel data writing sequence that reduces the computational resources consumed in generating parity correction codes (parity check data), thereby increasing work efficiency.

An exemplary embodiment provides a data writing method, adapted for a rewritable non-volatile memory module, wherein the rewritable non-volatile memory module comprises a plurality of word lines and a plurality of bit lines intersecting the plurality of word lines, wherein the intersection of the word lines and the bit lines forms a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets, the method comprising: obtaining a write command, wherein the write command is configured to instruct to write a write data into the rewritable non-volatile memory module; writing, according to the write command, a first data in the write data into a target physical unit of a target word line among the P word lines; selecting, after writing the first data, one or more further target physical units that are respectively located within one or more further target word lines when blank one or more physical units within the target word line are arranged after that target physical unit; and writing a second data, subsequent to the first data, of the write data into the selected one or more further target physical units.

An exemplary embodiment provides a data writing method, adapted for a rewritable non-volatile memory, wherein the rewritable non-volatile memory module comprises a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets, the method comprising: generating and transmitting, by a memory management circuit, a first write command sequence to instruct to write a first write data into a target physical erase unit of the plurality of physical erase units; generating and transmitting, by the memory management circuit, a second write command sequence to instruct to write a second write data into the target physical erase unit; writing, by a memory interface, the first write data into a first physical address in the target physical erase unit according to the first write command sequence; and writing, by the memory interface, the second write data into a second physical address in the target physical erase unit according to the second write command sequence, wherein the first word line to which the first physical address belongs is different from the second word line to which the second physical address belongs, wherein when the second write data is written into the second physical address within that target physical erase unit, blank one or more physical addresses are arranged after the first physical address within the first word line, wherein, during a time interval between the execution of the first write command sequence and the execution of the second write command sequence, no write command sequence for instructing to write data into the target physical erase unit is executed.

An exemplary embodiment provides a memory storage device, comprising: a connection interface unit, a rewritable non-volatile memory module, and a memory control circuit unit. The connection interface unit is configured to couple to a host system. The rewritable non-volatile memory module comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets. The memory control circuit unit is coupled to the connection interface unit and the rewritable nonvolatile memory module. Wherein, the memory control circuit unit is configured to: obtain a write command, wherein the write command is configured to instruct to write a write data into the rewritable non-volatile memory module; write, according to the write command, a first data in the write data into a target physical unit of a target word line among the P word lines; select, after writing the first data, one or more further target physical units that are respectively located within one or more further target word lines when blank one or more physical units within the target word line are arranged after that target physical unit; and write a second data, subsequent to the first data, of the write data into the selected one or more further target physical units.

An exemplary embodiment provides a memory storage device, comprising: a connection interface unit, a rewritable non-volatile memory module, and a memory control circuit unit. The connection interface unit is configured to couple to a host system. The rewritable non-volatile memory module comprises a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets. The memory control circuit unit is coupled to the connection interface unit and the rewritable nonvolatile memory module. Wherein, a memory management circuit of the memory control circuit unit is configured to generate and transmit a first write command sequence to instruct to write a first write data into a target physical erase unit of the plurality of physical erase units, wherein the memory management circuit is further configured to generate and transmit a second write command sequence to instruct to write a second write data into the target physical erase unit, wherein a memory interface of the memory control circuit unit is configured to write the first write data into a first physical address in the target physical erase unit according to the first write command sequence, wherein the memory interface is further configured to write the second write data into a second physical address in the target physical erase unit according to the second write command sequence, wherein the first word line to which the first physical address belongs is different from the second word line to which the second physical address belongs, wherein when the second write data is written into the second physical address within that target physical erase unit, blank one or more physical addresses are arranged after the first physical address within the first word line, wherein, during a time interval between the execution of the first write command sequence and the execution of the second write command sequence, no write command sequence for instructing to write data into the target physical erase unit is executed.

An exemplary embodiment provides a memory control circuit unit, comprising: a host interface, a memory interface, and a memory management circuit. The host interface is configured to couple to a host system. The memory interface is configured to couple to a rewritable non-volatile memory module, wherein the rewritable non-volatile memory module comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets. The memory management circuit is coupled to the host interface and the memory interface. Wherein, the memory management circuit is configured to: obtain a write command, wherein the write command is configured to instruct to write a write data into the rewritable non-volatile memory module; write, according to the write command, a first data in the write data into a target physical unit of a target word line among the P word lines; select, after writing the first data, one or more further target physical units that are respectively located within one or more further target word lines when blank one or more physical units within the target word line are arranged after that target physical unit; and write a second data, subsequent to the first data, of the write data into the selected one or more further target physical units.

An exemplary embodiment provides a memory control circuit unit, comprising: a host interface, a memory interface, and a memory management circuit. The host interface is configured to couple to a host system. The memory interface is configured to couple to a rewritable non-volatile memory module, wherein the rewritable non-volatile memory module comprises a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets. The memory management circuit is coupled to the host interface and the memory interface. Wherein, the memory management circuit is configured to generate and transmit a first write command sequence to instruct to write a first write data into a target physical erase unit of the plurality of physical erase units, wherein the memory management circuit is further configured to generate and transmit a second write command sequence to instruct to write a second write data into the target physical erase unit, wherein the memory interface is configured to write the first write data into a first physical address in the target physical erase unit according to the first write command sequence, wherein the memory interface is further configured to write the second write data into a second physical address in the target physical erase unit according to the second write command sequence, wherein the first word line to which the first physical address belongs is different from the second word line to which the second physical address belongs, wherein when the second write data is written into the second physical address within that target physical erase unit, blank one or more physical addresses are arranged after the first physical address within the first word line, wherein, during a time interval between the execution of the first write command sequence and the execution of the second write command sequence, no write command sequence for instructing to write data into the target physical erase unit is executed.

Based on the above, exemplary embodiments of the present invention may use the provided data writing sequences of different pattern to write multiple physical units corresponding to the same string set respectively in a plurality of word lines in the direction of the arrangement of the plurality of word lines, so as to save system resources in the process of generating parity check data. Such that, the efficiency of the memory storage device 10 and the memory control circuit 42 are improved. At the same time, it can also avoid the problem of write interference caused by write sequence different to the conventional way or avoid the problem of data loss caused by the failure caused during writing data.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 15B is a schematic diagram of generating parity check data shown according to another exemplary embodiment of the present invention.

DESCRIPTION OF THE EMBODIMENTS

In general, a memory storage device (also referred to as a memory storage system) includes a rewritable non-volatile memory module and a controller (also referred to as a control circuit). The memory storage device may be used with a host system, such that the host system may write data into the memory storage device or read data from the memory storage device.

Figure 1:
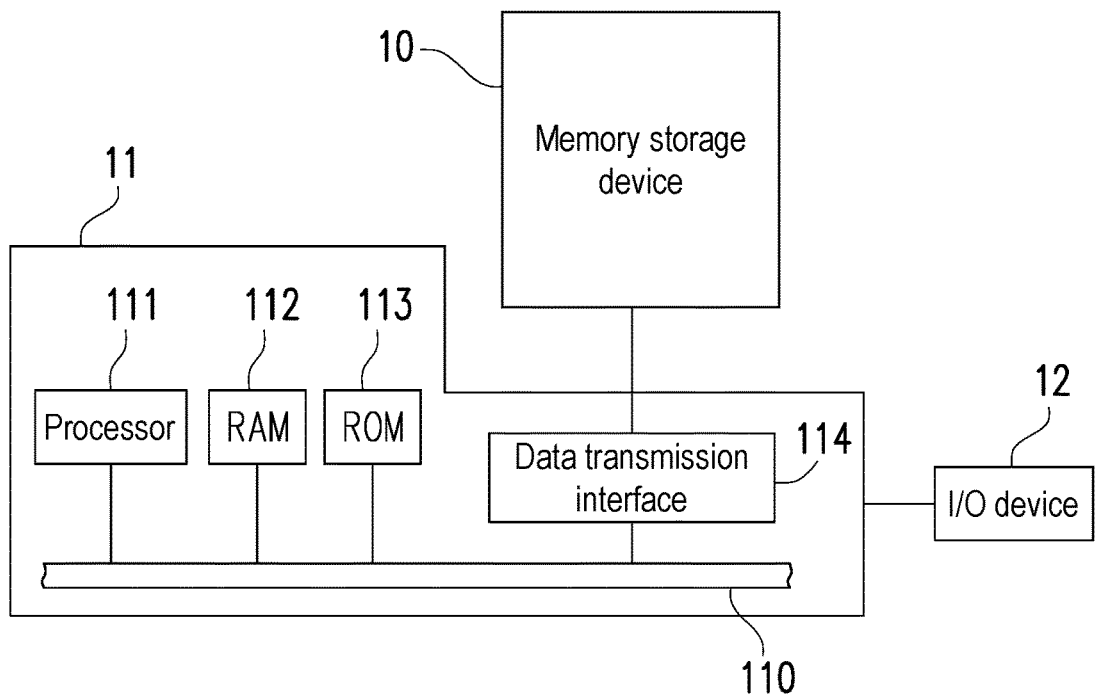
FIG. 1 is a schematic diagram of a host system, a memory storage device, and an input/output (I/O) device shown according to an exemplary embodiment of the present invention.
Figure 2:
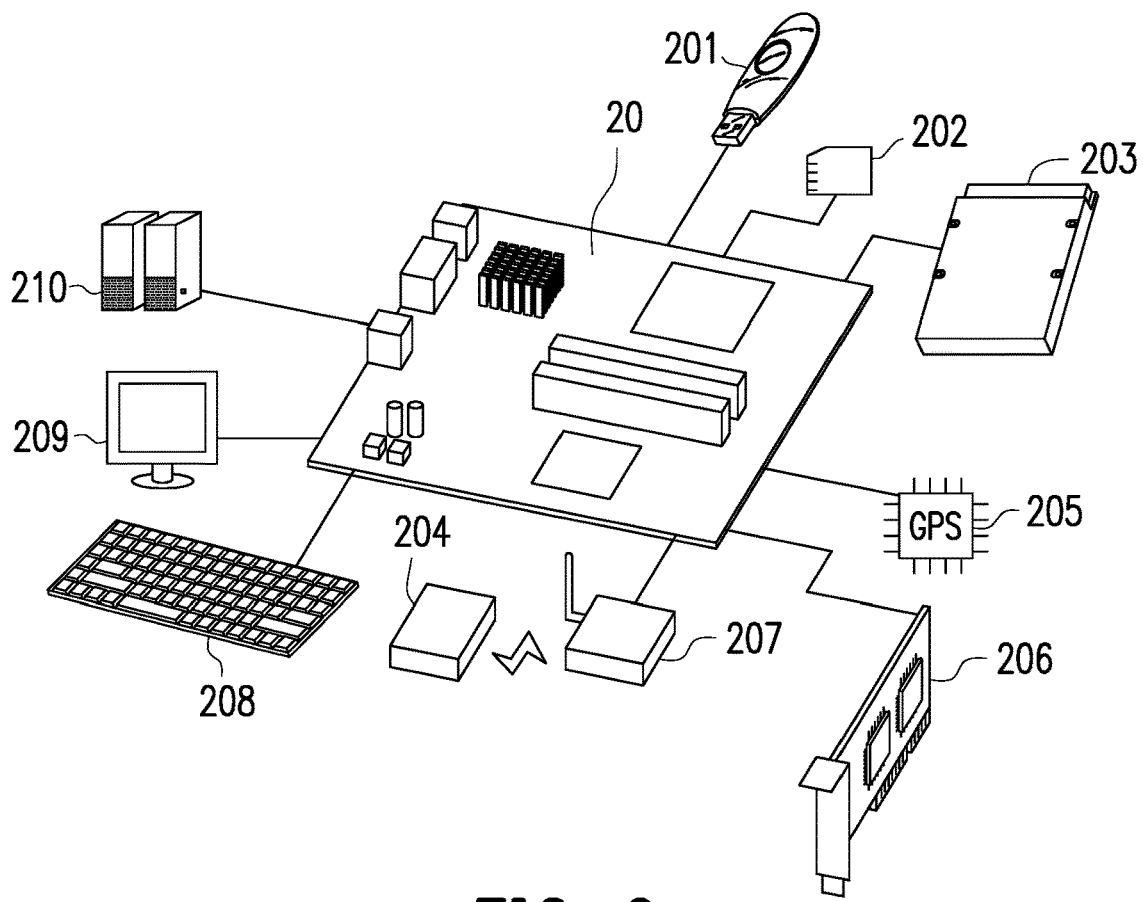
FIG. 2 is a schematic diagram of a host system, a memory storage device, and an I/O device shown according to an exemplary embodiment of the present invention.

FIG. 1 is a schematic diagram of a host system, a memory storage device, and an input/output (I/O) device shown according to an exemplary embodiment of the present invention. FIG. 2 is a schematic diagram of a host system, a memory storage device, and an I/O device shown according to an exemplary embodiment of the present invention.

Referring to FIG. 1 and FIG. 2, a host system 11 may include a processor 111, a random-access memory (RAM) 112, a read-only memory (ROM) 113, and a data transmission interface 114. The processor 111, the RAM 112, the ROM 113, and the data transmission interface 114 may be coupled to a system bus 110.

In an exemplary embodiment, the host system 11 may be coupled to the memory storage device 10 via the data transmission interface 114. For example, the host system 11 may store data into the memory storage device 10 or read data from the memory storage device 10 via the data transmission interface 114. Moreover, the host system 11 may be coupled to the I/O device 12 via the system bus 110. For example, the host system 11 may send an output signal to the I/O device 12 or receive an input signal from the I/O device 12 via the system bus 110.

In an exemplary embodiment, the processor 111, the RAM 112, the ROM 113, and the data transmission interface 114 may be disposed on a motherboard 20 of the host system 11. The quantity of the data transmission interface 114 may be one or a plurality. The motherboard 20 may be coupled to the memory storage device 10 in a wired or wireless method via the data transmission interface 114.

In an exemplary embodiment, the memory storage device 10 may be, for example, a flash drive 201, a memory card 202, a solid-state drive (SSD) 203, or a wireless memory storage device 204. The wireless memory storage device 204 may be, for example, a memory storage device based on various wireless communication techniques such as a near-field communication (NFC) memory storage device, a wireless fax (WiFi) memory storage device, a Bluetooth memory storage device, or a low-power Bluetooth memory storage device (such as iBeacon). Moreover, the motherboard 20 may also be coupled to various I/O devices such as a global positioning system (GPS) module 205, a network interface card 206, a wireless transmission device 207, a keyboard 208, a screen 209, or a speaker 210 via the system bus 110. For example, in an exemplary embodiment, the motherboard 20 may access the wireless memory storage device 204 via the wireless transmission device 207.

In an exemplary embodiment, the host system 11 is a computer system. In an exemplary embodiment, the host system 11 may be any system that may substantially store data with the memory storage device. In an exemplary embodiment, the memory storage device 10 and the host system 11 may respectively include a memory storage device 30 and a host system 31 of FIG. 3.

Figure 3:
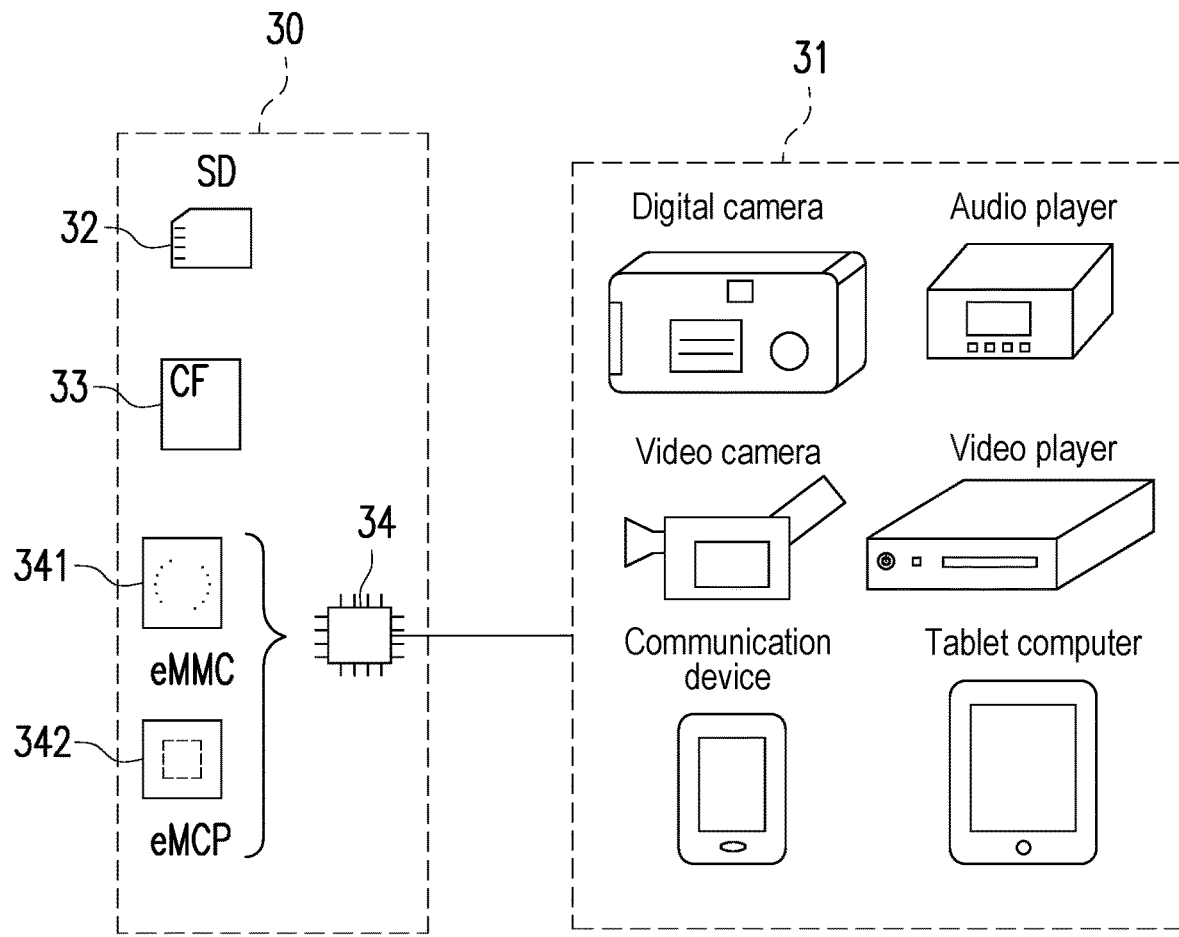
FIG. 3 is a schematic diagram of a host system and a memory storage device shown according to an exemplary embodiment of the present invention.

FIG. 3 is a schematic diagram of a host system and a memory storage device shown according to an exemplary embodiment of the present invention.

Referring to FIG. 3, the memory storage device 30 may be used in conjunction with the host system 31 to store data. For example, the host system 31 may be a system such as a digital camera, a camcorder, a communication device, an audio player, a video player, or a tablet computer. For example, the memory storage device 30 may be various non-volatile memory storage devices such as a Secure Digital (SD) card 32, a Compact Flash (CF) card 33, or an embedded storage device 34 used by the host system 31. The embedded storage device 34 includes various types of embedded storage devices for which a memory module is directly coupled on the substrate of the host system, such as an embedded multimedia card (eMMC) 341 and/or an embedded multi-chip package (eMCP) storage device 342.

Figure 4:
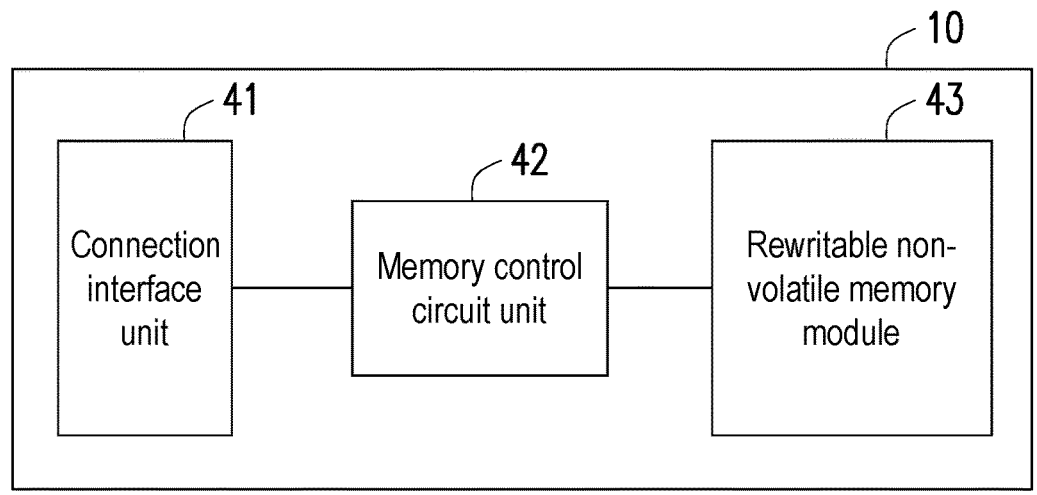
FIG. 4 is a schematic diagram of a memory storage device shown according to an exemplary embodiment of the present invention.

FIG. 4 is a schematic diagram of a memory storage device shown according to an exemplary embodiment of the present invention.

Referring to FIG. 4, the memory storage device 10 includes a connection interface unit 41, a memory control circuit unit 42, and a rewritable non-volatile memory module 43.

The connection interface unit 41 is configured to couple the memory storage device 10 to the host system 11. The memory storage device 10 may be communicated with the host system 11 via the connection interface unit 41. In an exemplary embodiment, the connection interface unit 41 is compatible with the Peripheral Component Interconnect Express (PCI Express) standard. In an exemplary embodiment, the connection interface unit 41 may also conform to the Serial Advanced Technology Attachment (SATA) standard, Parallel Advanced Technology Attachment (PATA) standard, Institute of Electrical and Electronic Engineers (IEEE) 1394 standard, Universal Serial Bus (USB) standard, SD interface standard, Ultra High Speed-I (UHS-I) interface standard, Ultra High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard, or other suitable standards. The connection interface unit 41 may be sealed in a chip with the memory control circuit unit 42. Alternatively, the connection interface unit 41 is disposed outside of a chip containing the memory control circuit unit 42.

The memory control circuit unit 42 is coupled to the connection interface unit 41 and the rewritable non-volatile memory module 43. The memory control circuit unit 42 is configured to perform a plurality of logic gates or control commands implemented in a hardware form or in a firmware form. The memory control circuit unit 404 also performs operations such as writing, reading, and erasing data in the rewritable non-volatile memory storage module 43 according to the commands of the host system 11.

The rewritable non-volatile memory module 43 is configured to store the data written by the host system 11. The rewritable non-volatile memory module 43 may include a single-level cell (SLC) NAND-type flash memory module (that is, a flash memory module that may store 1 bit in one memory cell), a multi-level cell (MLC) NAND-type flash memory module (that is, a flash memory module that may store 2 bits in one memory cell), a triple-level cell (TLC) NAND-type flash memory module (i.e., a flash memory module that may store 3 bits in one memory cell), a quad-level cell (QLC) NAND-type flash memory module (that is, a flash memory module that may store 4 bits in one memory cell), other flash memory modules, or other memory modules with the same characteristics.

Each of the memory cells in the rewritable non-volatile memory module 43 stores one or a plurality of bits via the change in voltage (also referred to as threshold voltage hereinafter). Specifically, a charge-trapping layer is disposed between the control gate and the channel of each of the memory cells. By applying a write voltage to the control gate, the number of electrons of the charge-trapping layer may be changed, and therefore the threshold voltage of the memory cells may be changed. This operation of changing the threshold voltage of the memory cells is also referred to as "writing data to the memory cells" or "programming the memory cells". As the threshold voltage is changed, each of the memory cells in the rewritable non-volatile memory module 43 has a plurality of storage states. Which storage state one memory cell belongs to may be determined via the application of a read voltage, so as to obtain one or a plurality of bits stored by the memory cell.

In an exemplary embodiment, the memory cells of the rewritable non-volatile memory module 43 may form a plurality of physical programming units, and these physical programming units may form a plurality of physical erasing units. Specifically, the memory cells on the same word line may form one or a plurality of physical programming units. If one memory cell may store two or more bits, the physical programming units on the same word line may at least be classified into lower physical programming units and upper physical programming units. For example, the least significant bit (LSB) of a memory cell belongs to the lower physical programming units, and the most significant bit (MSB) of a memory cell belongs to the upper physical programming units. Generally, in an MLC NAND-type flash memory, the write speed of the lower physical programming units is greater than the write speed of the upper physical programming units, and/or the reliability of the lower physical programming units is greater than the reliability of the upper physical programming units.

In an exemplary embodiment, the physical programming unit is the smallest unit of programming. That is, the physical programming unit is the smallest unit of data writing. For example, the physical programming unit may be a physical page or a physical sector. If the physical programming unit is a physical page, then the physical programming unit may include a data bit region and a redundancy bit region. The data bit region contains a plurality of physical sectors configured to store user data, and the redundancy bit region is configured to store system data (for example, management data such as an error correcting code). In an exemplary embodiment, the data bit region contains 32 physical sectors, and the size of one physical sector is 512 bytes (B). However, in other exemplary embodiments, the data bit region may also contain 8, 16, or a greater or lesser number of physical sectors, and the size of each of the physical sectors may also be greater or smaller. Moreover, the physical erasing unit is the smallest unit of erasing. That is, each of the physical erasing units contains the smallest number of memory cells erased together. For example, the physical erasing unit is a physical block.

In an exemplary embodiment, the memory cells in the rewritable non-volatile memory module 43 are disposed in a three-dimensional array. However, in another exemplary embodiment, the memory cells in the rewritable non-volatile memory module 43 are disposed in a two-dimensional array.

Figure 5A:
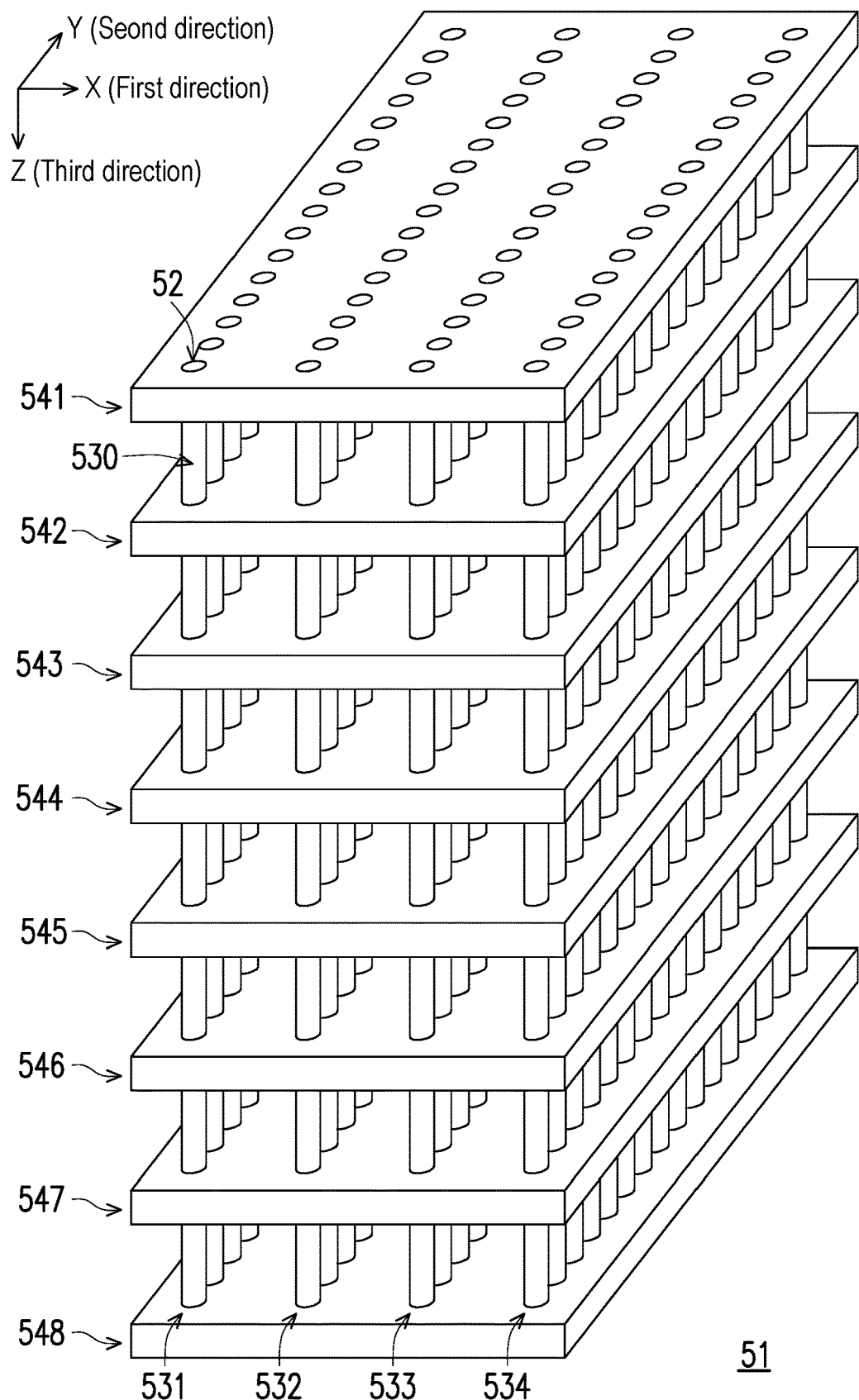
FIG. 5A is a schematic diagram of a three-dimensional memory cell array shown according to an exemplary embodiment of the present invention.

FIG. 5A is a schematic diagram of a three-dimensional memory cell array shown according to an exemplary embodiment of the present invention.

Referring to FIG. 5A, the memory cell array 51 includes a plurality of memory cells 52 for storing data, a plurality of string sets 531-534, and a plurality of word lines 541-548. The string sets 531 to 534 are independent of each other (e.g., separate from each other) and are arranged along a first direction (e.g., X-axis direction). Each of the string sets 531 to 534 includes a plurality of bit lines 530 that are independent of each other (e.g., separate from each other). The bit lines 530 in each string set are arranged along a second direction (e.g., Y-axis direction) and extend along a third direction (e.g., Z-axis direction). The word lines 541 to 548 are independent of each other (e.g., separate from each other) and stack along a third direction.

In an exemplary embodiment, each of the word lines 541 to 548 may also be considered as a word line plane. Each memory cell 52 is formed at each intersection between each bit line 530 of the string set 531-534 and word line 541-548.

It should be noted that, the memory cell array 51 of FIG. 5A is only one example, and in other exemplary embodiments not mentioned, the total number of the memory cells 52, the total number of the string sets 531 to 534, and the total number of the word line layers 541 to 548 may all be different. Moreover, in another exemplary embodiment, one string sets may include more or fewer bit lines, and one word line may also allow more or fewer string sets to pass. Alternatively, in an exemplary embodiment, the memory cells in the rewritable non-volatile memory module 43 may also be disposed in other ways, which are not limited in the invention.

In other words, the rewritable non-volatile memory module 43 includes a plurality of word lines and a plurality of bit lines intersecting the plurality of word lines, wherein the intersection of the plurality of word lines and the plurality of bit lines forms a plurality of memory cells for storing data. In an embodiment, each word line 541 to 548 (each plane) arranged along the third direction may be divided into M segments based on M string sets (e.g., 4 string sets arranged along the first direction in FIG. 5A), multiple memory cells that formed in each segment can be regarded as a physical unit. Wherein, N memory cells, corresponding to the same string set, formed by each of the M segments and the N bit lines that intersect, and the N memory cells form a physical unit. N, M and P are positive integers. Furthermore, in the exemplary embodiment, the plurality of word lines and the plurality of bit lines intersecting the word lines form a three-dimensional structure, wherein the plurality of bit lines are grouped into the M string sets sequentially arranged along a first direction, N bit lines of each string set are arranged sequentially along a second direction and are extended along a third direction, wherein the P word lines corresponding to the same string set are sequentially arranged along the third direction and are extended along the second direction, wherein the P word lines are arranged along the third direction, wherein the N bit lines of each string set meet into the respective P segments in the P bit lines corresponding to the same string set to form the M×N memory cells in each word line, so as to form M physical units, corresponding to the M string sets, arranged along the first direction in each word line, wherein the first direction, the second direction, and the third direction are perpendicular to each other.

Figure 5B:
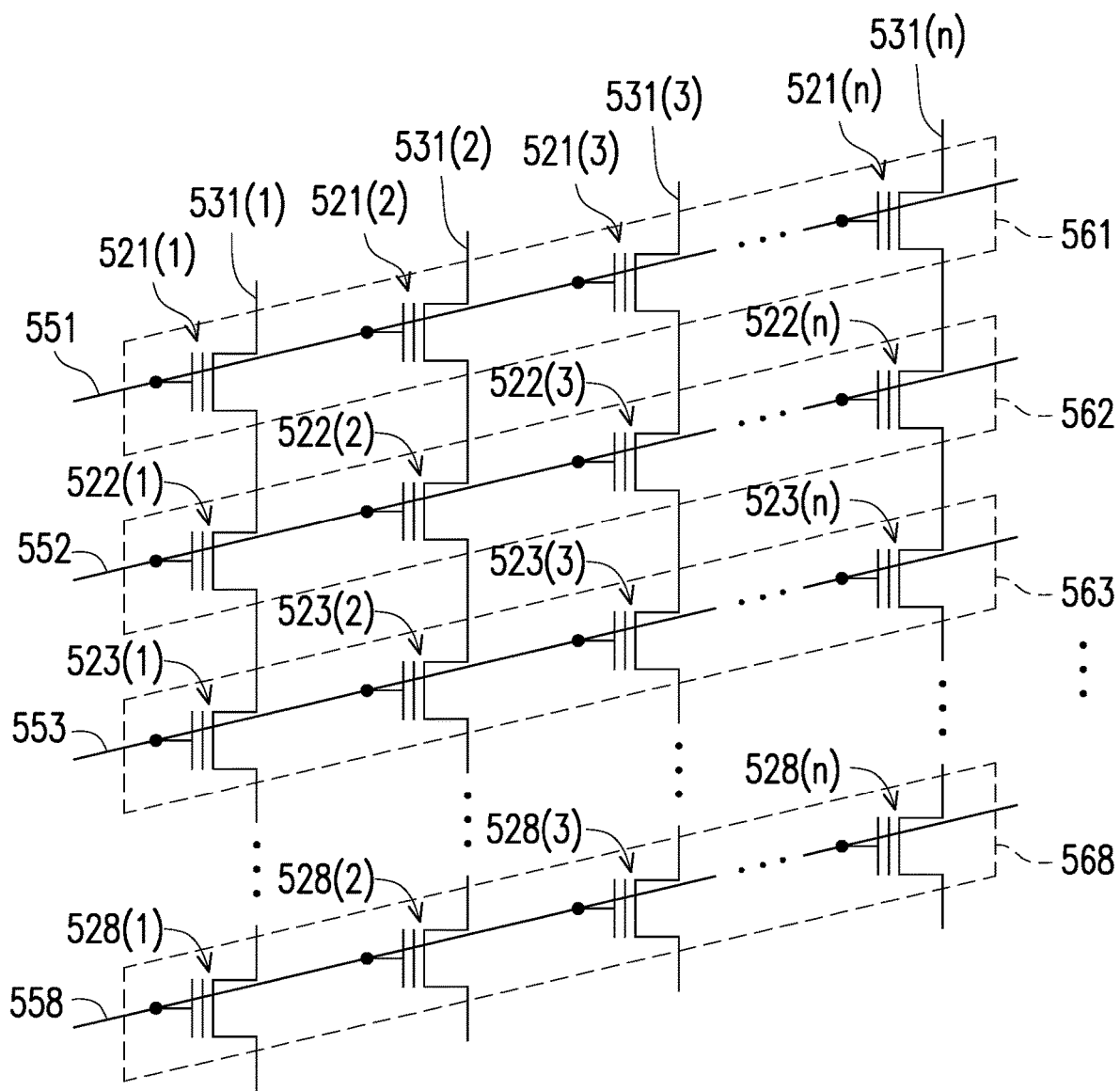
FIG. 5B is a schematic diagram of an equivalent circuit for a three-dimensional memory cell array shown according to an exemplary embodiment of the present invention.

FIG. 5B is a schematic diagram of an equivalent circuit for a three-dimensional memory cell array shown according to an exemplary embodiment of the present invention.

Referring to FIG. 5A and FIG. 5B, transistor units 521(1) to 521(n) may be located in the word line 541. Transistor units 522(1) to 522(n) may be located in the word line 542. Transistor units 523(1) to 523(n) may be located in the word line 543. Transistor units 528(1) to 528(n) may be located in the word line 548. One transistor unit may be equivalent to one memory cell. The string set 531 may include bit lines 531(1) to 531(n). A bit line 531(1) is connected in series to the transistor unit 521(1), the transistor unit 522(1), the transistor unit 523(1) . . . and the transistor unit 528(1). A bit line 531(2) is connected in series to the transistor unit 521(2), the transistor unit 522(2), the transistor unit 523(2) . . . and the transistor unit 528(2). A bit line 531(3) is connected in series to the transistor unit 521(3), the transistor unit 522(3), the transistor unit 523(3) . . . and the transistor unit 528(3). By analogy, a bit line 531(n) is connected in series to the transistor unit 521(n), the transistor unit 522(n), the transistor unit 523(n) . . . and the transistor unit 528(n).

A segment 551 is located at the word line 541. A segment 552 is located at the word line 542. A segment 553 is located at the word line 543. By analogy, a segment 558 is located at the word line 548. The segment 551 is connected in series to the transistor units 521(1) to 521(n). The segment 552 is connected in series to the transistor units 522(1) to 522(n). The segment 553 is connected in series to the transistor units 523(1) to 523(n). The segment 558 is connected in series to the transistor units 528(1) to 528(n). It should be noted that FIG. 5B only shows a portion of the members in each of the word lines in FIG. 5A, and the rest may be deduced by analogy.

In the present exemplary embodiment, the total number of transistor units connected in series to the same segment of the same word line may be equal to the total number of memory cells included in one physical unit. For example, the transistor units 521(1) to 521(n) are included in the physical unit 561, the transistor units 522(1) to 522(n) are included in the physical unit 562, the transistor units 523(1) to 523(n) are included in the physical unit 563, and the transistor units 528(1) to 528(n) are included in the physical unit 568. Taking the physical unit 561 as an example, when the data stored in the physical unit 561 is to be read, the storage states of the transistor units 521(1) to 521(n) may be read simultaneously; in addition, when data is to be stored in the physical unit 561, the transistor units 521(1) to 521(n) may be programmed simultaneously.

In an exemplary embodiment, the total number of memory cells included in each of the physical units 561 to 568 is equal to the total number of memory cells included in one physical programming unit. That is, in an exemplary embodiment, the physical units 561 to 568 are respectively regarded as one physical programming unit. In an exemplary embodiment, at least one of the physical units 561 to 568 may also include a plurality of physical programming units.

Figure 6:
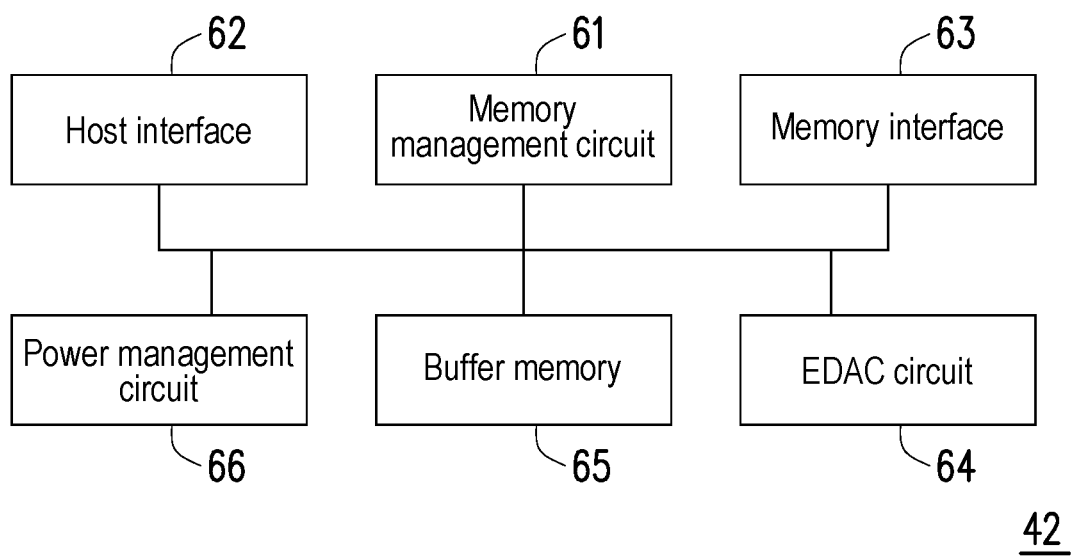
FIG. 6 is a schematic diagram of a memory control circuit unit shown according to an exemplary embodiment of the present invention.

FIG. 6 is a schematic diagram of a memory control circuit unit shown according to an exemplary embodiment of the present invention.

Referring to FIG. 6, the memory control circuit unit 42 includes a memory management circuit 61, a host interface 62, and a memory interface 63. The memory management circuit 61 is configured to control the overall operation of the memory control circuit unit 42. Specifically, the memory management circuit 61 has a plurality of control commands. During the operation of the memory storage device 10, the control commands are executed to perform operations such as writing, reading, and erasing data. In the following, descriptions relating to the operation of the memory management circuit 61 are equivalent to the descriptions of the operation of the memory control circuit unit 42.

In an exemplary embodiment, the control commands of the memory management circuit 61 are implemented in a firmware form. For example, the memory management circuit 61 has a microprocessor unit (not shown) and a read-only memory (not shown), and the control commands are burned into a ROM. During the operation of the memory storage device 10, the control commands are executed by a microprocessor unit to perform operations such as writing, reading, and erasing data.

In an exemplary embodiment, the control commands of the memory management circuit 61 may also be stored in the form of program codes in a specific area (for example, the system area in a memory module exclusively configured to store system data) of the rewritable non-volatile memory module 43. Moreover, the memory management circuit 61 has a microprocessor unit (not shown), a ROM (not shown), and a RAM (not shown). In particular, the ROM has a boot code, and when the memory control circuit unit 42 is enabled, the microprocessor unit first executes the boot code to load the control commands stored in the rewritable non-volatile memory module 43 into the RAM of the memory management circuit 61. Next, the microprocessor unit runs the control commands to perform operations such as writing, reading, and erasing data.

In an exemplary embodiment, the control commands of the memory management circuit 61 may also be implemented in a hardware form. For example, the memory management circuit 61 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured to manage the memory cells or memory cell groups of the rewritable non-volatile memory module 43. The memory write circuit is configured to issue a write command sequence to the rewritable non-volatile memory module 43 to write data into the rewritable non-volatile memory module 43. The memory read circuit is configured to issue a read command sequence to the rewritable non-volatile memory module 43 to read data from the rewritable non-volatile memory module 43. The memory erase circuit is configured to issue an erase command sequence to the rewritable non-volatile memory module 43 to erase data from the rewritable non-volatile memory module 43. The data processing circuit is configured to process data to be written into the rewritable non-volatile memory module 43 and data read from the rewritable non-volatile memory module 43. The write command sequence, the read command sequence, and the erase command sequence may independently include one or a plurality of program codes or command codes and be configured to instruct the rewritable non-volatile memory module 43 to perform corresponding operations such as writing, reading, and erasing. In an exemplary embodiment, the memory management circuit 61 may also issue other types of command sequences to the rewritable non-volatile memory module 43 to instruct the performance of corresponding operations.

The host interface 62 is coupled to the memory management circuit 61. The memory management circuit 61 may be communicated with the host system 11 via the host interface 62. The host interface 62 may be used to obtain and identify commands and data of the host system 11. For example, the commands and data of the host system 11 may be sent to the memory management circuit 61 via the host interface 62. In addition, the memory management circuit 61 may send data to the host system 11 via the host interface 62. In the present exemplary embodiment, the host interface 62 is compatible with the PCI Express standard. However, it should be understood that the invention is not limited thereto, and the host interface 62 may also be compatible with the SATA standard, PATA standard, IEEE 1394 standard, USB standard, SD standard, UHS-I standard, UHS-II standard, MS standard, MMC standard, eMMC standard, UFS standard, CF standard, IDE standard, or other suitable standards for data transmission.

The memory interface 63 is coupled to the memory management circuit 61 and configured to access the rewritable non-volatile memory module 43. For example, the memory management circuit 61 may access the rewritable non-volatile memory module 43 via the memory interface 63. In other words, data to be written into the rewritable non-volatile memory module 43 is converted to a format acceptable to the rewritable non-volatile memory module 43 via the memory interface 63. Specifically, if the memory management circuit 61 is to access the rewritable non-volatile memory module 43, the memory interface 63 sends a corresponding command sequence. For example, the command sequences may include a write command sequence instructing data writing, a read command sequence instructing data reading, an erase command sequence instructing data erasing, and corresponding command sequences configured to instruct various memory operations (such as changing read voltage level or performing a garbage collection operation). The command sequences are generated by, for example, the memory management circuit 61 and sent to the rewritable non-volatile memory module 43 via the memory interface 63. The command sequences may include one or a plurality of signals or data on a bus. The signals or data may include a command code or a program code. For example, when reading a command sequence, information such as read identification code or memory address is included.

In an exemplary embodiment, the memory control circuit unit 42 further includes an error detection and correction circuit 64, a buffer memory 65, and a power management circuit 66.

The error detection and correction circuit 64 is coupled to the memory management circuit 61 and configured to execute an error detection and correction operation to ensure the correctness of data. Specifically, when the memory management circuit 61 obtains a write command from the host system 11, the error detection and correction circuit 64 generates a corresponding error correcting code (ECC) and/or an error detecting code (EDC) for data corresponding to the write command, and the memory management circuit 61 writes the data corresponding to the write command and the corresponding ECC and/or EDC into the rewritable non-volatile memory module 43. Next, when data is read from the rewritable non-volatile memory module 43, the memory management circuit 61 reads the ECC and/or the EDC corresponding to the data at the same time, and the error detection and correction circuit 64 executes an error detection and correction operation on the read data based on the ECC and/or the EDC. In addition, in one embodiment, the error detection and correction circuit 64 is configured to generate corresponding parity check data (also known as RAID parity data) based on the written data and the tag (also known as RAID Tag) corresponding to the written data, and the corresponding written data can then be protected by the generated parity check data.

The buffer memory 65 is coupled to the memory management circuit 61 and configured to temporarily store data. The power management circuit 66 is coupled to the memory management circuit 61 and configured to control the power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 61 of FIG. 6 may include a flash memory management circuit.

Figure 7:
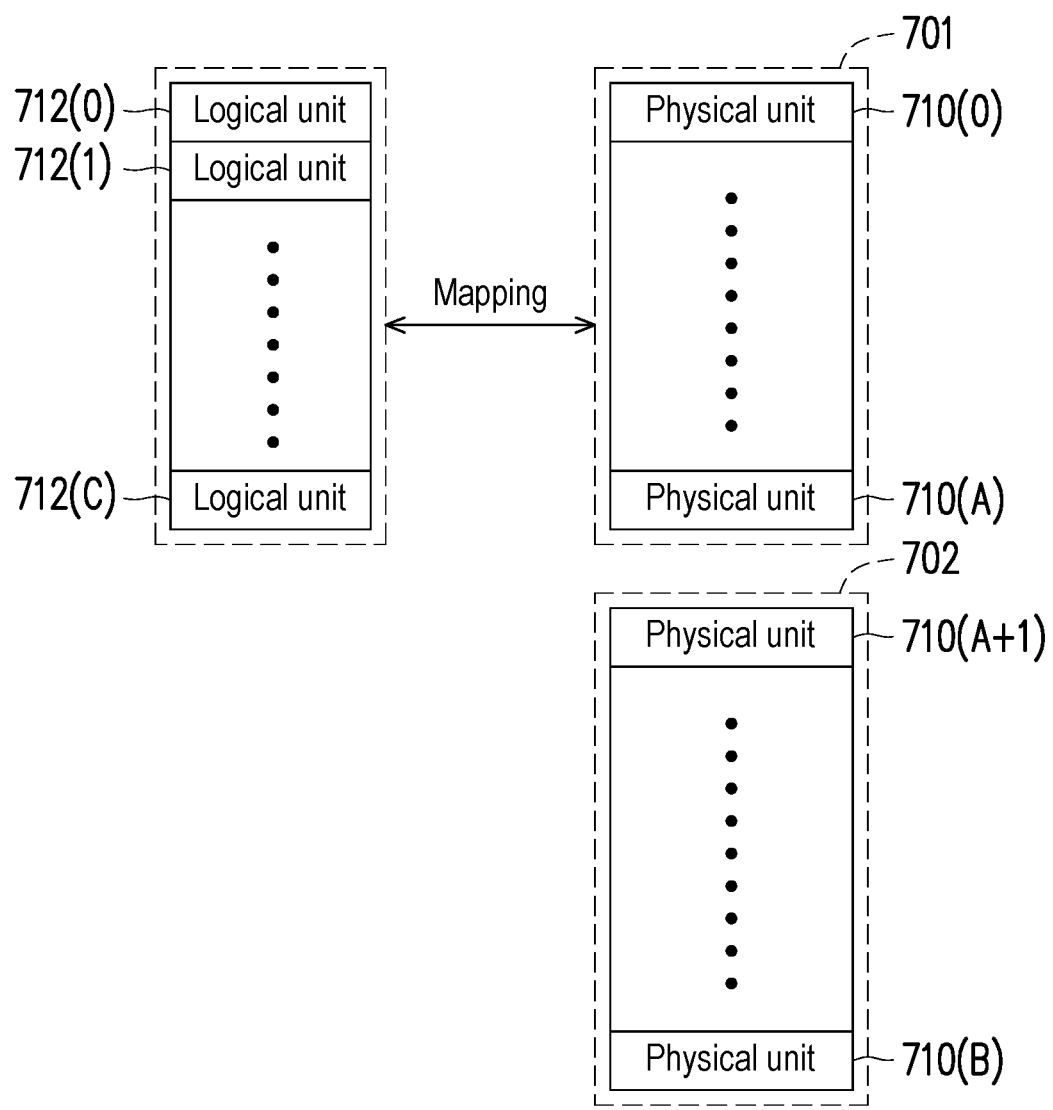
FIG. 7 is a schematic diagram of a managed rewritable non-volatile memory module shown according to an exemplary embodiment of the present invention.

FIG. 7 is a schematic diagram of a managed rewritable non-volatile memory module shown according to an exemplary embodiment of the present invention.

Referring to FIG. 7, the memory management circuit 61 may logically group physical units 710(0) to 710(B) in the rewritable non-volatile memory module 43 into a storage region 701 and a spare region 702.

The physical units 710(0) to 710(A) in the storage region 701 are configured to store user data (for example, user data from the host system 11 in FIG. 1). For example, the physical units 710(0) to 710(A) in the storage region 701 may store valid data and/or invalid data. The physical units 710(A+1) to 710(B) in the spare region 702 do not store data (for example, valid data). For example, if a certain physical unit does not store valid data, this physical unit may be associated (or added) to the spare region 702. In addition, the physical units in the spare region 702 (or physical units that do not store valid data) may be erased. When writing new data, one or a plurality of physical units may be extracted from the spare region 702 to store the new data. In an exemplary embodiment, the spare region 702 is also referred to as a free pool.

The memory management circuit 61 may configure logical units 712(0) to 712(C) to map the physical units 710(0) to 710(A) in the storage region 701. In an exemplary embodiment, each of the logical units corresponds to one logical address. For example, one logical address may include one or a plurality of logical block addresses (LBAs) or other logical management units. In an exemplary embodiment, one logical unit may also correspond to one logical programming unit or formed by a plurality of continuous or discontinuous logical addresses.

It should be mentioned that, one logical unit may be mapped to one or a plurality of physical units. If a certain physical unit is currently mapped by a certain logical unit, the data currently stored in this physical unit includes valid data. On the other hand, if a certain physical unit is not currently mapped by any logical unit, the data currently stored in this physical unit is invalid data.

The memory management circuit 61 may record the management data describing the mapping relationship between logical units and physical units (also called logical-to-physical mapping information) in at least one logical-to-physical mapping table. When the host system 11 of FIG. 1 is to read data from the memory storage device 10 or write data to the memory storage device 10, the memory management circuit 61 may access the rewritable non-volatile memory module 43 according to the information in the logical-to-physical mapping table to store data in the rewritable non-volatile memory module 43 or read data from the rewritable non-volatile memory module 43.

The memory management circuit 61 may obtain a write command from the host system 11 of FIG. 1. The write command may instruct a writing of data to at least one logical unit. The memory management circuit 61 may implement the data write method provided in the exemplary embodiment to perform a corresponding data write operation to write the corresponding write data into the at least one physical unit in a specific write sequence. After the memory management circuit 61 writes the data corresponding to the write command into the at least one physical unit, a corresponding logic-to-physical mapping table is updated to map the at least one physical unit to the at least one logical unit.

The data writing method provided by the exemplary embodiment is described in detail below by FIGS. 8A through 13.

Figure 8A:
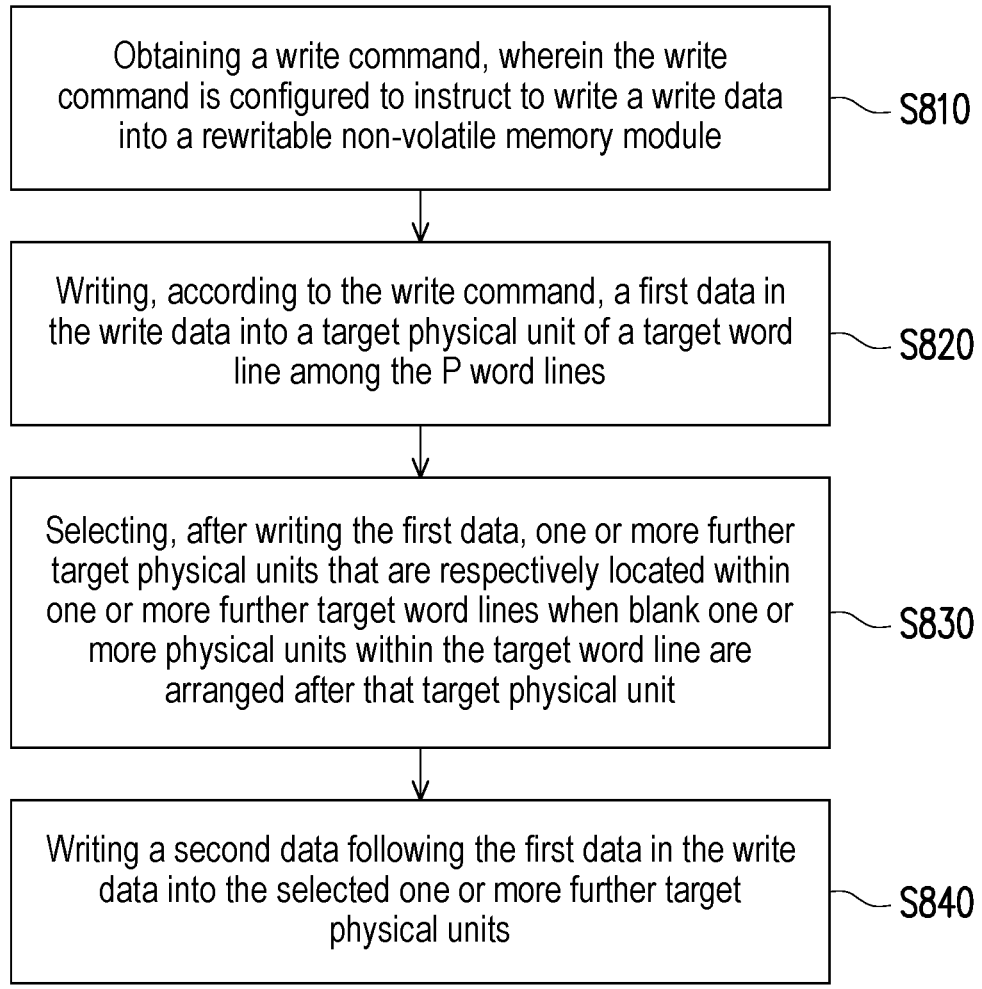
FIG. 8A is a flowchart of a data writing method shown according to an exemplary embodiment of the present invention.

FIG. 8A is a flowchart of a data writing method shown according to an exemplary embodiment of the present invention.

Referring to FIG. 8A, in step S810, memory control circuit unit 42 obtaining a write command, wherein the write command is configured to instruct to write a write data into the rewritable non-volatile memory module. The write command is, for example, a write command obtained from the host system 11 (also known as a host write command), or a write command generated by the memory control circuit unit 42 (e.g., a write command sequence).

Next, in step S820, memory control circuit unit 42 writing, according to the write command, a first data in the write data into a target physical unit of a target word line among the P word lines. P is a positive integer, the amount of P is preset based on the hardware specifications of the rewritable non-volatile memory module 43, and the present invention is not limited thereto. That is, the first data will be written to a physical unit (target physical unit) in one (target word line) of the multiple word lines.

In an embodiment, wherein the step of writing, according to the write command, the first data in the write data into the target physical unit of the target word line among the P word lines includes: memory control circuit unit 42 writes the first data into $j^{th}$ physical unit corresponding to $j^{th}$ string set within it word line, wherein the $i^{th}$ word line is the target word line, and the $j^{th}$ physical unit is the target physical unit. i, j are positive integers.

Next, in step S830, memory control circuit unit 42 selecting, after writing the first data, one or more further target physical units that are respectively located within one or more further target word lines when blank one or more physical units within the target word line are arranged after that target physical unit. That is, after the first data is written, one or more physical units in the target word line arranged, along the first direction, behind the target physical unit remain blank physical units to which data may be written. However, at this time point, the memory control circuit unit 42 does not follow the conventional manner of directly selecting the blank one or more physical units arranged after the target physical unit for subsequent data writing operation. But, the memory control circuit unit 42 selects one or more further target physical units respectively located within one or more further target word lines to perform subsequent data writing operation. The one or more further target word lines may be one or more word lines arranged, along the third direction, before or after the target word line, and the one or more further target physical units of the one or more further target word lines are blank. For ease of illustration, an example of the one or more further target word lines arranged, along the third direction, after the target word line will be given below.

Next, in step S840, memory control circuit unit 42 writing a second data, subsequent to the first data, of the write data into the selected one or more further target physical units. That is, after selecting the one or more further target physical units, the memory control circuit unit 42 performs a subsequent data write operation to write the second data into the selected one or more further target physical units.

In an embodiment, wherein the steps of writing the second data into the one or more further target physical units respectively located within the one or more further target word lines includes: memory control circuit unit 42 writes the second data into the $j^{th}$ physical unit corresponding to the $j^{th}$ string set within $i+1^{th}$ word line, wherein the $i+1^{th}$ word line is the further target word line, and the $j^{th}$ physical unit within the $i+1^{th}$ word line is the further target physical unit.

Furthermore, in the embodiment, after writing the second data, if a following data write operation is about to be executed, memory control circuit unit 42 writes a third data, subsequent to the second data, of the write data into a $j+1^{th}$ physical unit corresponds to a $j+1^{th}$ string set in the $i^{th}$ word line, wherein $j^{th}$ physical unit corresponding to the $j^{th}$ string set in the $i+2^{th}$ word line is blank, and writes a fourth data, subsequent to the third data, of the write data into a $j+1^{th}$ physical unit corresponds to a $j+^{th}$ string set in the $i+1^{th}$ word line, wherein $j^{th}$ physical unit corresponding to the $j^{th}$ string set in the $i+2^{th}$ word line is blank.

Figure 9A:
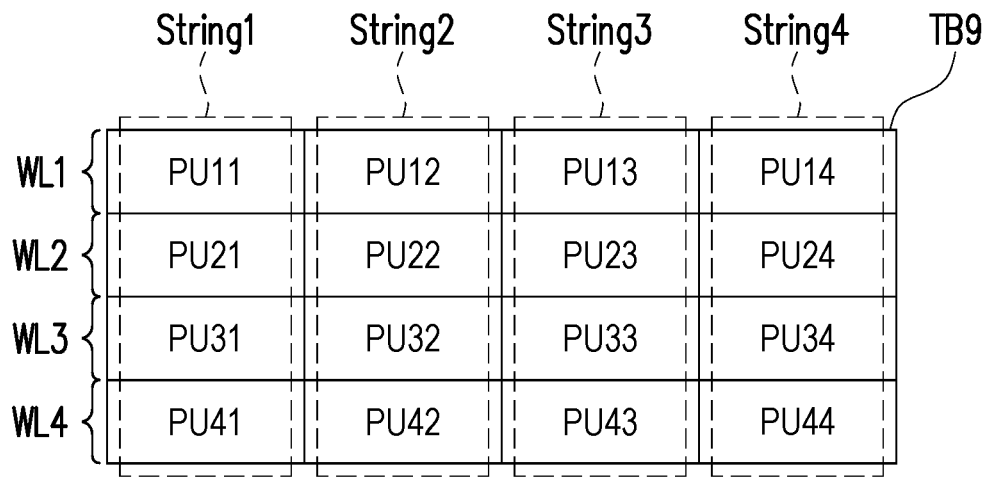
FIG. 9A is a schematic diagram of a plurality of physical units corresponding to different word lines and string sets shown according to an exemplary embodiment of the present invention.

FIG. 9A is a schematic diagram of a plurality of physical units corresponding to different word lines and string sets shown according to an exemplary embodiment of the present invention.

Referring to FIG. 9A, for illustrative purposes, the following is illustrated with SLC-type of the rewritable non-volatile memory module. That is, in the embodiment, each physical unit is 1 physical page (or 1 programming unit). However, the data writing method provided by the present invention can also be applied to TLC or other types of rewritable non-volatile memory modules.

Further, in this example, the rewritable non-volatile memory module has a number of word lines of 4 (e.g., word lines WL1 to WL4 shown in FIG. 9A) and a number of string sets of 4 (e.g., string sets String1 to String4 shown in FIG. 9A). Each word line has 4 physical units respectively corresponding to the plurality of string sets (as blocks shown in FIG. 9A), and the arrangement order of the 4 physical units is the same as the arrangement order of the plurality of string sets. For example, physical unit PU12 corresponding to string set String2 is arranged, along the first direction (as illustrated by FIG. 5A), after physical unit PU11 corresponding to the first one string set String1. In addition, word line WL2 is arranged, along the third direction (as illustrated by FIG. 5A), after word line WL1.

In addition, regarding string sets String1, String2, String3, and String4: word line WL1 has physical units PU11, PU12, PU13, PU14; word line WL2 has physical units PU21, PU22, PU23, PU24; word line WL3 has physical units PU31, PU32, PU33, PU34; and word line WL4 has physical units PU41, PU42, PU43, PU44. When a physical unit corresponding to a specified word line and a specified string set is written with data, the physical unit is completely written at once.

Figure 8B:
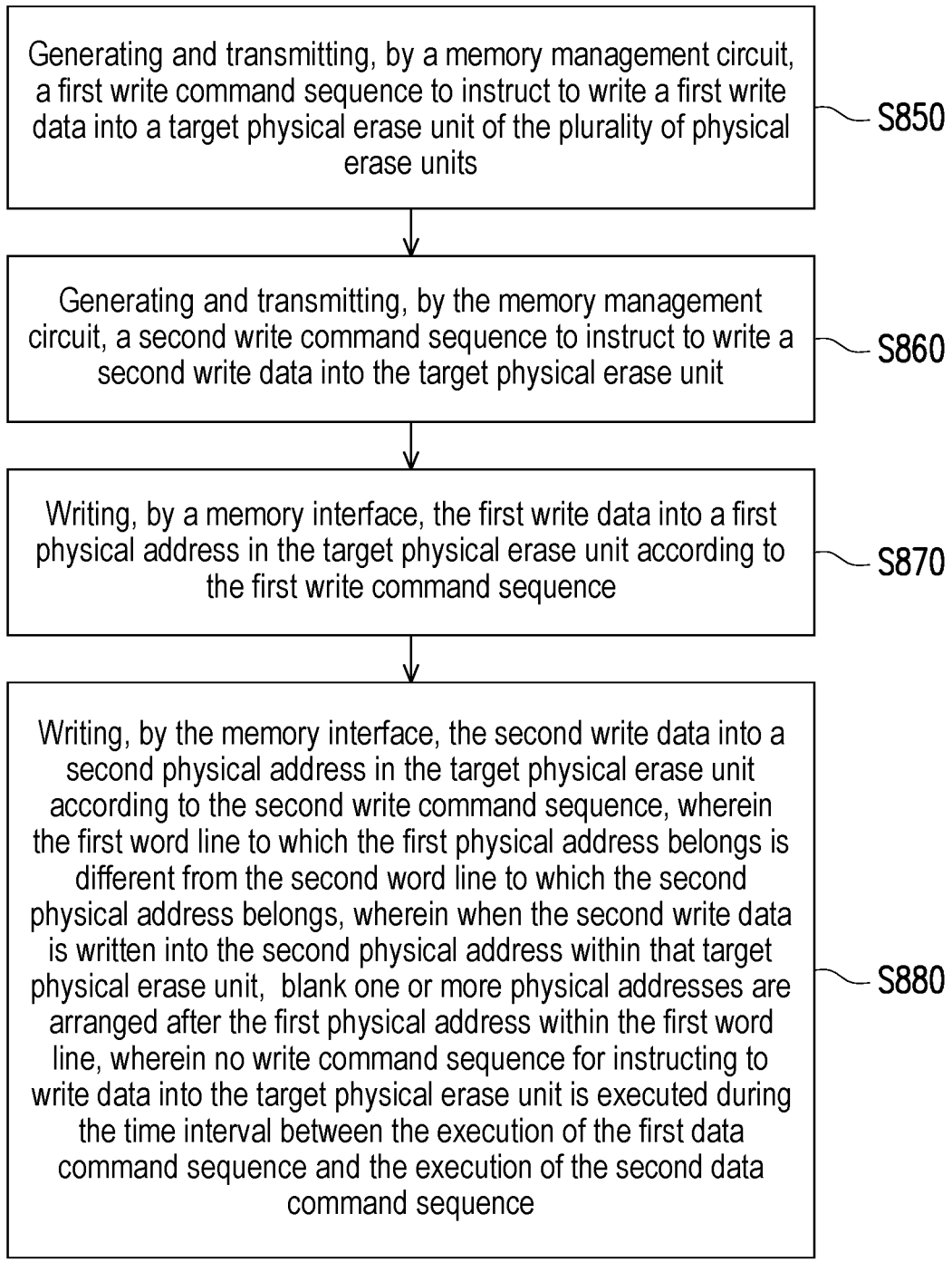
FIG. 8B is a flowchart of another data writing method shown according to an exemplary embodiment of the present invention.

FIG. 8B is a flowchart of another data writing method shown according to an exemplary embodiment of the present invention.

Referring to FIG. 8B, FIG. 8B illustrates a data writing method from the perspective of a memory control circuit. In step S850, generating and transmitting, by the memory management circuit 61, a first write command sequence to instruct to write a first write data into a target physical erase unit of the plurality of physical erase units. Each physical erase unit comprises a plurality of word lines and a plurality of bit lines intersecting the plurality of word lines, wherein the intersection of the plurality of word lines and the plurality of bit lines constitutes a plurality of memory cells for storing data.

Next, in step S860, generating and transmitting, by the memory management circuit 61, a second write command sequence to instruct to write a second write data into the target physical erase unit.

Figure 9B:
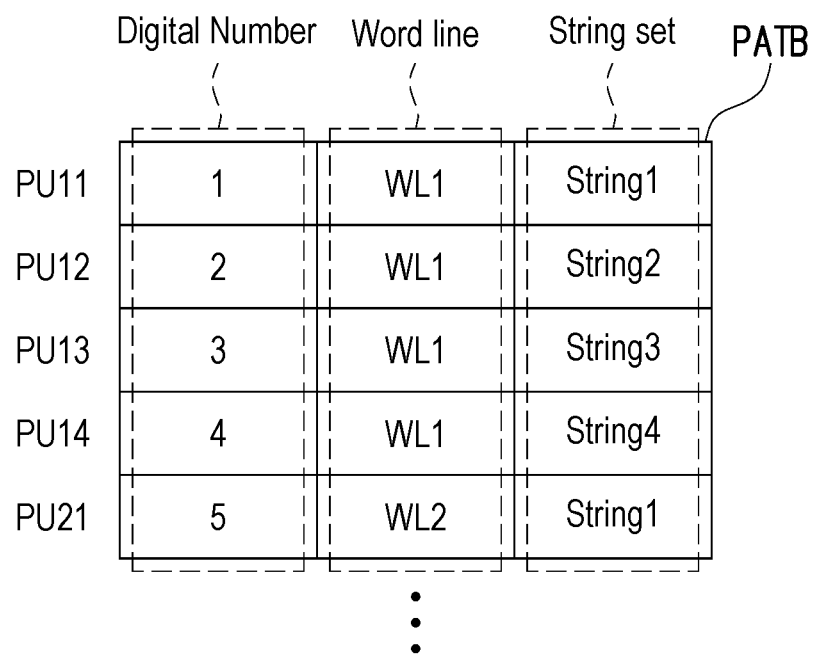
FIG. 9B is a schematic diagram of a physical address list drawn according to an exemplary embodiment of the present invention.

In more detail, referring to FIG. 9B, the memory management circuit 61 records a physical address list PATB, wherein data in multiple fields of the physical address list PATB includes: a plurality of physical address numbers corresponding to a plurality of physical addresses (e.g., the numbers "1" to "5" in the physical address list PATB), a plurality of word line identifiers respectively corresponding to the plurality of physical address numbers (e.g., the word line identifiers "WL1" and "WL2" in the physical address list PATB), and a plurality of string set identifiers respectively corresponding to the plurality of physical address numbers (e.g., the string set identifiers "String1" to "String4" in the physical address list PATB). The physical addresses corresponding to the physical address numbers in the physical address list PATB are grouped into a plurality of groups of physical addresses according to order of the word line identifiers, wherein a plurality of physical addresses in each group of physical addresses are arranged according to order of corresponding string sets, wherein the physical address numbers are arranged in ascending order. By querying the physical address list PATB, a word line and a string set of each physical unit (e.g., physical unit PU11-PU21) corresponding to each physical address number can be queried.

In the embodiment, step S850 includes: generating, by the memory management circuit 61, the first write command sequence according to a first physical address number among the physical address numbers to instruct to write the first write data into the first physical address corresponding to the first physical address number, wherein the first physical address is a first physical unit, corresponding to the first physical address number, of a first string set in a first word line.

Furthermore, step S860 includes: generating, by the memory management circuit 61, the second write command sequence according to a second physical address number among the physical address numbers to instruct to write the second write data into the second physical address corresponding to the second physical address number, wherein the second physical address is a second physical unit, corresponding to the second physical address number, of a second string set in a second word line. It should be noted that the first physical address number and the second physical address number respectively corresponding to the first and second write command sequence are not two consecutive physical address numbers in the physical address list.

Additionally, in an embodiment, the first string set corresponding to the first physical address number in the first word line and the second string set corresponding to the second physical address number in the second word line are substantially the same string set. For example, a first write data is written to physical unit PU11 (which belongs to the string set String1) as shown in FIG. 9A, and a second write data is written to physical unit PU21 (which belongs to the string set String1) as shown in FIG. 9A.

However, in another embodiment, the first string set corresponding to the first physical address number in the first word line and the second string set corresponding to the second physical address number in the second word line are not the same string set. For example, a first write data is written to physical unit PU21 (which belongs to the string set String1) as shown in FIG. 9A, and a second write data is written to physical unit PU12 (which belongs to the string set String2) as shown in FIG. 9A.

Next, in step S870, writing, by a memory interface 63, the first write data into a first physical address in the target physical erase unit according to the first write command sequence.

Next, in step S880, writing, by the memory interface 63, the second write data into a second physical address in the target physical erase unit according to the second write command sequence. The first word line to which the first physical address belongs is different from the second word line to which the second physical address belongs, wherein when the second write data is written into the second physical address within that target physical erase unit, blank one or more physical addresses are arranged after the first physical address within the first word line, wherein, during a time interval between the execution of the first write command sequence and the execution of the second write command sequence, no write command sequence for instructing to write data into the target physical erase unit is executed.

Assuming, for example, that a first write command sequence is generated based on a first physical address number "1", which is configured to instruct to write data into a physical unit PU11 corresponding to the string set String1 in the word line WL1; a second write command sequence is generated based on a second physical address number "5", which is configured to instruct to write data into a physical unit PU21 corresponding to the string set String1 in the word line WL2. At the time when a second data corresponding to the second write command sequence is written to the second physical address (No. "5") in the target physical erase unit, blank one or more physical addresses (No. "2" to "4") arranged after the first physical address (No. "1") in the word line WL1.

Figure 10:
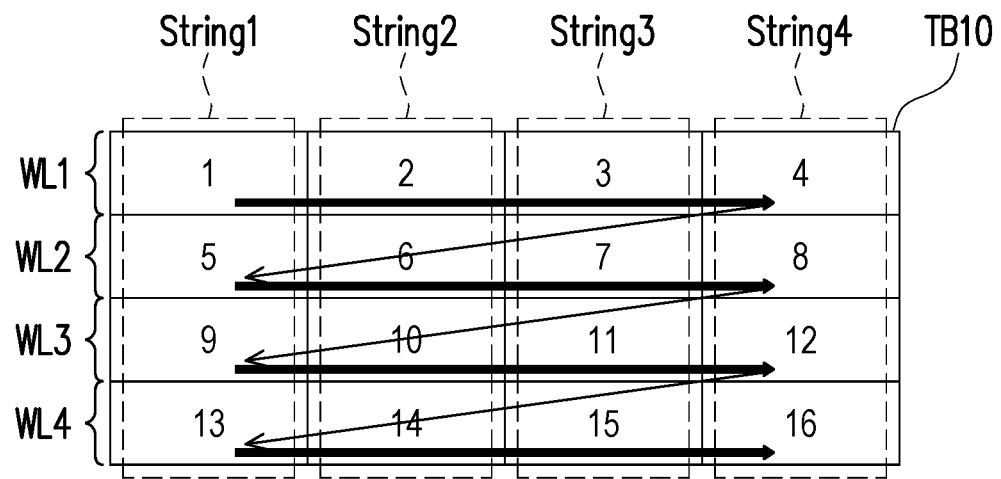
FIG. 10 is a schematic of a conventional write sequence for physical units shown according to the art of learning.

FIG. 10 is a schematic of a conventional write sequence for physical units shown according to the art of learning.

Referring to both FIG. 9A and FIG. 10, the numbers in each box and the arrows in the schema are used to indicate the order in which the corresponding physical units were written, as shown in table TB10 (the meaning of the number and arrows will not be described further below). In general, the specification manual for the rewritable non-volatile memory module 43 suggests that when performing a write operation to the rewritable non-volatile memory module 43, it should be done in accordance with the suggested sequence of FIG. 10. That is to say, traditionally, the memory control circuit unit 42 will first sequentially perform data writing operation to all the physical units in one word line, according to the arrangement order along the first direction of the corresponding string sets, until there are no more blank physical units left in the word line being written. And, in the succeeding data writing operation, the data will be written to a physical unit in the next word line.

For example, it is assumed that the writing starts from word line WL1 and physical units PU11-PU14 of word line WL1 are blank (can be written data). In this example, the writing will start from the $1^{st}$ physical unit PU11 (e.g., the writing sequence is 1) corresponding to the $1^{st}$ string set String1 in the word line WL1, then start to write to the $2^{nd}$ physical unit PU12 (e.g., the writing sequence is 2) corresponding to the $2^{nd}$ string set String2, then start to write to the $3^{rd}$ physical unit PU13 (e.g., the writing sequence is 3) corresponding to the $3^{rd}$ string set String3, then start to write to the $4^{th}$ physical unit PU14 (e.g., the writing sequence is 4) corresponding to the $4^{th}$ string set String4. Next, since there are no more blank physical units in word line WL1, a physical unit in next word line to word line WL1 will be selected for writing. For example, it will start writing from the $1^{st}$ physical unit PU21 (e.g., writing sequence is 5) corresponding to the $1^{st}$ string set String1 in the word line WL2, and so on.

Unlike the traditional approach to write sequencing, based on the data writing method provided in this exemplary embodiment, after writing data to a target physical unit in a target word line, even if there are other blank physical units arranged after the target physical unit in the target word line, the memory control circuit unit 42 first selects one or more physical units (also known as, further target physical units) corresponding to the same string set in one or more word lines (also known as, further target word lines) arranged after the target word line to perform the subsequent data writing operation. That is, the further target physical units used to perform the subsequent data writing operation are one or more physical units arranged along the third direction behind the target physical unit, each of the further target physical units are respectively located in one or more word lines arranged along the third direction behind the target word line.

Figure 11:
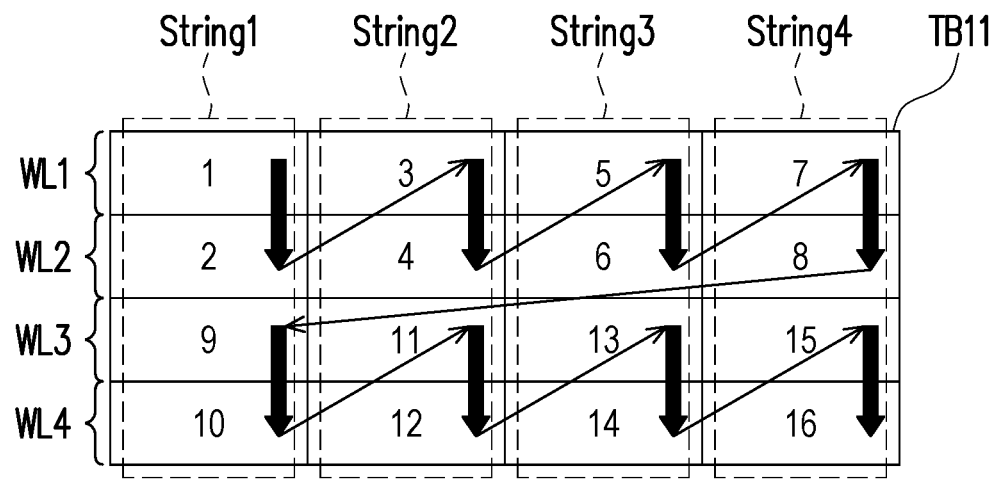
FIG. 11 is a schematic diagram of a writing sequence of a first pattern for physical units shown according to an exemplary embodiment of the present invention.

FIG. 11 is a schematic diagram of a writing sequence of a first pattern for physical units shown according to an exemplary embodiment of the present invention.

For example, referring to FIG. 9A and FIG. 11, it is assumed that the writing starts from word line WL1 and physical units PU11-PU14 of word line WL1 are blank (can be written data). In this example, as shown in table TB11, the writing will start from the $1^{st}$ physical unit PU11 (e.g., the writing sequence is 1) corresponding to the $1^{st}$ string set String1 in the word line WL1.

At this time, the physical units PU12-PU14 arranged after the physical unit PU11 in the word line WL1 are blank, and the physical units PU21-PU24 in the word line WL2, which is arranged after the word line WL1 along the third direction, are blank. Next, the memory control circuit unit 42 selects a physical unit PU21 (e.g., the writing sequence is 2) corresponding to the same string set String1 in the word line WL2 to perform the successive data writing operation.

At this time, the physical units PU22-PU24 arranged after the physical unit PU21 in the word line WL2 are blank, and the physical units PU31-PU34 in the word line WL3, which are arranged after the word line WL2 along the third direction, are blank. Next, the memory control circuit unit 42 selects a blank physical unit PU12 (e.g., the writing sequence is 3) corresponding to the next string set String2 in the previous word line WL1 to perform the successive data writing operation. It should be noted that the memory control circuit unit 42 does not select the physical unit PU31 corresponding to the string set String1 in the word line WL3 to perform the data writing operation with the writing sequence of 3.

Next, similar to the process from writing sequence "1" to writing sequence "2", the memory control circuit unit 42 selects a physical unit PU22 (e.g., the writing sequence is 4) corresponding to the string set String2 in the word line WL2 to perform the successive data writing operation.

That is, in the first pattern of the writing sequence, the memory control circuit unit 42 selects the string set to be written based on the order in which the string sets are arranged along the first direction to write data to one or more sets of physical units adjacent along the third direction (e.g., the physical unit PU11 and the physical unit PU21 are a set of adjacent physical units), such that the data writing sequence of multiple physical units within each set of adjacent word lines (e.g., word lines WL1 and WL2 are a set of adjacent word lines) is similar to the trajectory of a continuous inverted N shape.

It should be noted that in the above example, the number of physical units per set is 2, but the invention is not limited thereto.

Specifically, in another embodiment, after writing that second data, the data writing method further includes: before writing the third data, subsequent to the second data, of the write data, determining whether a blank $j^{th}$ physical unit, corresponding to the $j^{th}$ string set, located in the $i+2^{th}$ word line is existed. That is, after writing the second data to the $j^{th}$ physical unit in the $i+1^{th}$ word line, the memory control circuit unit 42 goes on to determine whether there is a blank $j^{th}$ physical unit (a physical unit is arranged along the third direction and after the physical unit storing the second data) corresponding to the $j^{th}$ string set in the $i+2^{nd}$ word line after the $i+1^{th}$ word line arranged in the third direction.

Next, in response to determining that the blank $j^{th}$ physical unit, corresponding to the $j^{th}$ string set, located in the $i+2^{th}$ word line is existed, writing the third data into the blank $j^{th}$ physical unit, corresponding to the $j^{th}$ string set, in the $i+2^{th}$ word line. That is, if it is determined that a blank physical unit corresponding to the same string set exists in the next word line, the memory control circuit unit 42 writes successive third data to this blank physical unit in the next word line, this physical unit belongs to the same string set as the previous written physical unit and is arranged along the third direction after the previous written physical unit, and so on. In other words, to perform successive data writing operations, the memory control circuit unit 42 writes multiple physical units belonging to the same string set within multiple word lines arranged along the third direction, until all these physical units (corresponding to the same string set and arranged along the third direction) are filled.

On the other hand, in response to determining that the blank $j^{th}$ physical unit, corresponding to the $j^{th}$ string set, located in the $i+2^{th}$ word line is not existed, writing the third data into a $j+1^{th}$ physical unit, corresponding to a $j+1^{th}$ string set, in the it word line. That is, if it is determined that no blank physical unit corresponding to the same string set exists in the next word line or if it is determined that there is no longer a next word line, the memory control circuit unit 42 writes the successive third data to a blank physical unit (i.e., the $j+1^{th}$ physical unit of the $i^{th}$ word line) corresponding to the next string set (i.e., the $j+1^{th}$ string set) in the first word line. In other words, to perform a successive data write operation, when it is not possible to continue writing data to the next physical unit along the third direction, the memory control circuit unit 42 may, from next string set, continue to write, along the third direction, the multiple physical units respectively in the multiple word lines.

Figure 12:
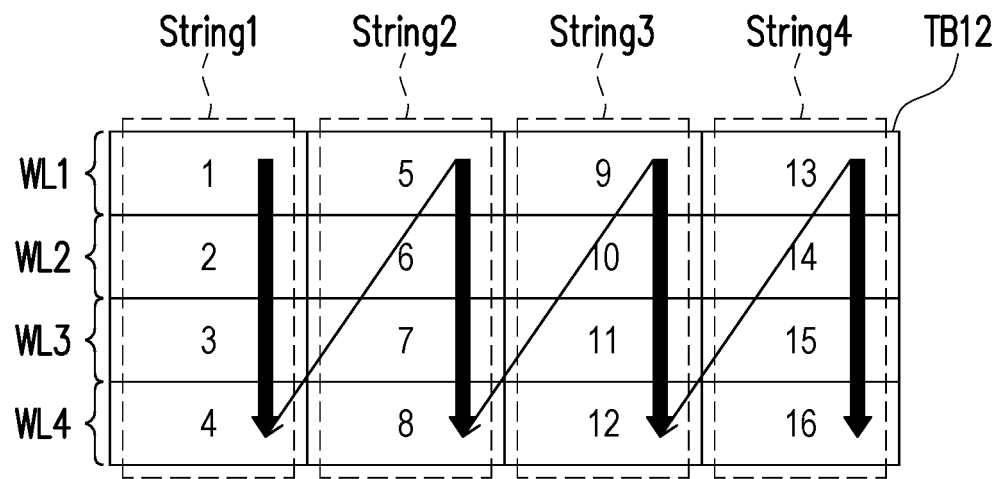
FIG. 12 is a schematic diagram of a writing sequence for a second pattern for physical units shown according to an exemplary embodiment of the present invention.

FIG. 12 is a schematic diagram of a writing sequence for a second pattern for physical units shown according to an exemplary embodiment of the present invention.

Unlike the example of FIG. 11, the number of physical units in each group of the second pattern writing sequence can be 2 or more.

For example, referring to both FIG. 9A and FIG. 12, assuming that a total number of word lines is 4, the memory control circuit unit 42 starts writing from word line WL1, the physical units PU11-PU14 of the word line WL1 are blank (can be written data). In this example, as shown in table TB12, writing starts from the $1^{st}$ physical unit PU11 (e.g., writing sequence is 1) corresponding to the $1^{st}$ string set String1 in the word line WL1.

At the meantime, the physical units PU12-PU14 in the word line WL1 arranged after the physical unit PU11 are blank, and the physical units PU21-PU24 in the word line WL2 arranged after the word line WL1 along the third direction are blank. Then, the memory control circuit unit 42 selects the physical unit PU21 (e.g., writing sequence is 2) corresponding to the same string set String1 in the word line WL2 to perform the successive data writing operation.

At this time, the physical units PU22-PU24 in the word line WL2 arranged after the physical unit PU21 are blank, and the physical units PU31-PU34 in the word line WL3 arranged after the word line WL2 along the third direction are blank. Then, the memory control circuit unit 42 selects physical unit PU31 (e.g., writing sequence is 3) corresponding to the same string set String1 in the word line WL3 to perform the successive data writing operation. By analogy, the memory control circuit unit 42 selects the physical unit PU41 (e.g., writing sequence is 4) corresponding to the same string set String1 in the next word line WL4 to perform the successive data writing operation.

In the embodiment, when the number of written multiple physical units corresponding to the same string set reaches a predetermined value (e.g., 4), the memory control circuit unit 42 selects physical unit of the next string set to perform subsequent data writing operations.

That is, as shown in Table TB12, similar to the process of writing sequence 1 to writing sequence 4, the memory control circuit unit 42 sequentially selects a plurality of physical units PU12-PU42 (e.g., writing sequences are 5-8) belonging to the next string set String2 to perform successive data writing operations.

That is, in the second pattern writing sequence, the memory control circuit unit 42 selects string set to be written based on the order in which the string sets are arranged along the first direction, and writes data to multiple physical units of the same string set along the third direction and for the physical units of the same selected string set (e.g., physical units PU11-PU41 are multiple physical units corresponding to the same string set String1), such the data writing sequence of the second pattern resembles as a continuous inverted N-shapes, with each inverted N-shape being larger than or equal to the size of the N-shape of the writing sequence of the first pattern.

In the second pattern writing sequence, steps S820 to steps S840 include writing the first data and the second data into a plurality of first physical units, corresponding to a $j^{th}$ string set, respectively located in a plurality of first word lines arranged along the third direction. When the plurality of first physical units that have been written to reaches a predetermined value, the memory control circuit unit 42 writes the third data, successive to the second data in the write data, into a plurality of second physical units, corresponding to the $j+1^{th}$ word string set, respectively located in the plurality of first word lines arranged along the third direction, wherein a third physical unit arranged after the plurality of first physical units along that third direction may be blank.

In an embodiment, a total number of the plurality of first physical units is determined based on a data amount ratio required to generate the parity check data. In more detail, the memory control circuit unit 42 may generate parity check data corresponding to the first data and the second data based on written the first data and the second data, wherein the ratio between the size of that first data and that second data and the size of the generated parity check data is the data amount ratio, and the plurality of first physical units having the total number are used for storing the first data and the second data. For example, assume that each physical unit is 16 KB, and that the size of the first data is 16 KB, the size of the second data is 12 KB, and the size of the corresponding generated parity check data is 4 KB. In this example, the data amount ratio is (16+12):4, i.e. 7:1. The predetermined value of the total number of multiple physical units in a group for storing the first data and the second data is set to 2, such that the total size of each group of physical units is sufficient to store the first data, the second data and the parity check data (e.g., the physical units PU11 and PU21 in FIG. 15A store the write data and parity check data PRT1 according to the data amount ratio "7:1"). Detailed examples will be illustrated later in FIGS. 14 to 16.

Referring to FIG. 15B, in another implementation example, parity check data corresponding to a data amount ratio of 7:1 is generated, for example, by utilizing data from seven physical units to generate one physical unit of the parity check data. For example, as shown in Table TB153 in FIG. 15B, the memory control circuit unit 42 may generate parity check data PRT1 based on data stored in the physical units PU11-PU71 corresponding to the string set String1, and the generated parity check data PRT1 is stored in the physical unit PU81 of the string set String1.

It should be noted that an extreme example of a second pattern writing sequence would be that the predetermined value, corresponding to the total number of a group of the multiple physical units corresponding to the same string set, in a round of data write operations is just the total number of all word lines. That is, when all physical units corresponding to one string set located in all word lines have been written with data, the memory control circuit unit 42 selects physical units corresponding to the next string set from the starting word line to sequentially (along the third direction) perform the subsequent data writing operation (next round of the data writing operation).

That is, in response to determining that there exist the blank one or more third physical units, corresponding to the $j^{th}$ string set, arranged, along the third direction, after the plurality of first physical units, the memory control circuit unit 42 is configured to write the third data into the blank one or more third physical units, wherein the blank one or more third physical units are respectively located at one or more second word lines arranged, along the third direction, after the plurality of first word lines; and in response to determining that there does not exist the blank one or more third physical units, corresponding to the $j^{th}$ string set, arranged, along the third direction, after the plurality of first physical units, the memory control circuit unit 42 is configured to write the third data into a plurality of second physical units, corresponding to a $j+1^{th}$ string set, respectively located in the plurality of first word lines arranged along the third direction.

In an exemplary embodiment, after writing a group of P physical units corresponding to a string set (e.g., a $j^{th}$ string set), the memory control circuit unit 42 backs up the data stored in P physical units corresponding to the $j^{th}$ string set respectively in the P word lines and the parity check data corresponding to the written data before writing the subsequent third data to a plurality of physical units corresponding to the next string set (e.g., the $j+1^{th}$ word string set). For example, the written data and that parity check data corresponding to the written data can be backed up into other physical erase units. After backing up the data corresponding to the $j^{th}$ string set and the parity check data corresponding to the data, the memory control circuit unit 42 writes the third data into the plurality of second physical units, corresponding to the $j+1^{th}$ string set, respectively located in the plurality of first word lines arranged along the third direction. In this way, the problem of data loss due to errors in the written data caused by writing sequence, different from the conventional writing sequence, of the first pattern or the second pattern can be avoided.

Figure 13:
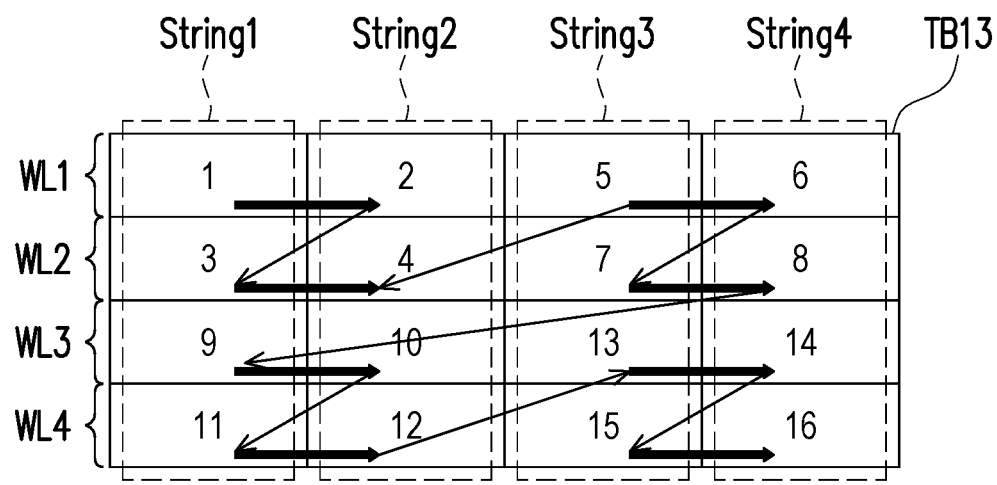
FIG. 13 is a schematic diagram of a writing sequence for a third pattern for physical units shown according to an exemplary embodiment of the present invention.

FIG. 13 is a schematic diagram of a writing sequence for a third pattern for physical units shown according to an exemplary embodiment of the present invention.

Referring to FIG. 13, in another embodiment, as shown in table TB13, according to the writing sequence of the third pattern, the traces of the write sequences that the memory control circuit unit 42 performs successive data writing operations of the plurality of physical units within each group of word lines can be regarded as a plurality of side-by-side zigzag traces (e.g., write sequences 1 to 4, write sequences 5 to 8 corresponding to a group of word lines WL1, WL2 are two side-by-side zigzag traces). Briefly, after each write of two physical units respectively corresponding to two string sets within a word line, the memory control circuit unit 42 selects two physical units corresponding to the same two string sets in the next word line to be written. It should be noted that in this embodiment, the width of each Z trace can be preset on demand. However, it should be noted that the width of each Z trace will be less than the total number of all string sets.

Figure 14:
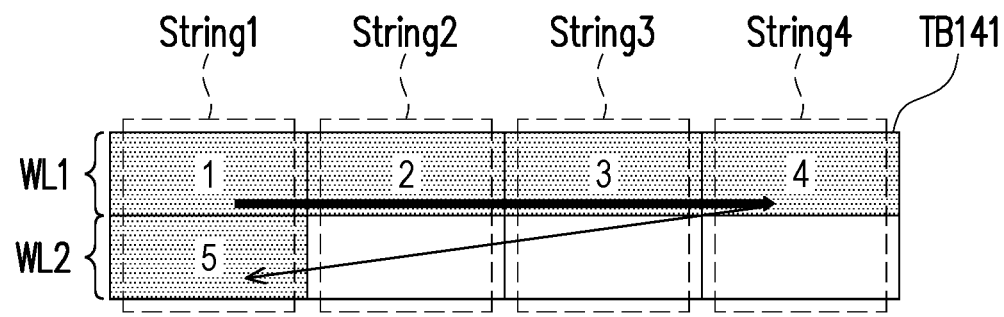
FIG. 14 is a schematic diagram of generating parity check data shown according to the prior art.
Figure 14:
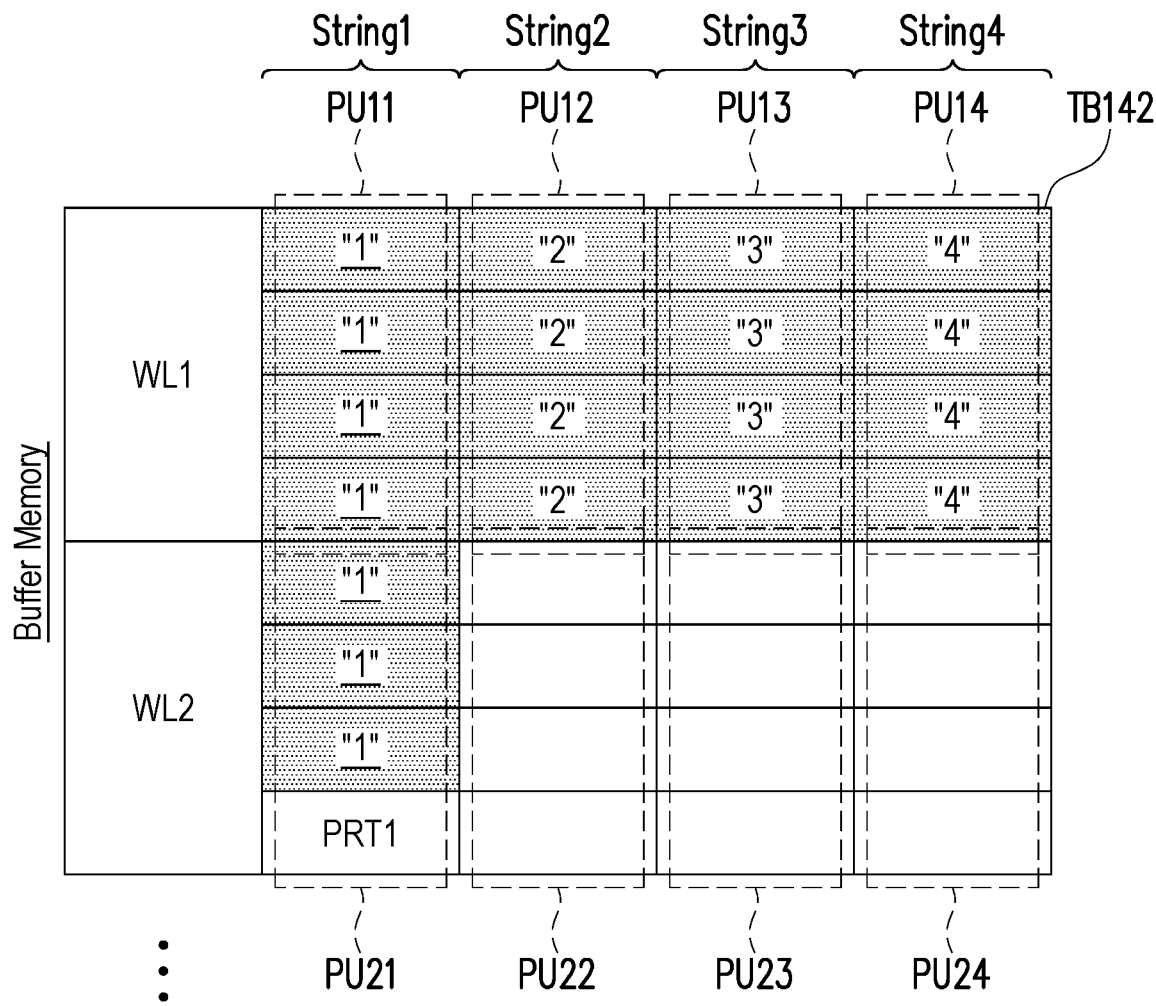

FIG. 14 is a schematic diagram of generating parity check data shown according to the prior art.

Referring to FIG. 14, assuming that each physical unit can store four basic unit sizes of data, the numbers (e.g., numbers 1 to 5) in table TB141 are used to indicate the writing sequence, and the numbers in table TB142 (e.g., numbers "1" to "4", and each label corresponds to a basic unit size of data) are used to indicate the number of the labels. The label number can be used to indicate the order in which the physical units are arranged in the word line to which they belong. In addition, it is assumed that the data amount ratio used to generate the parity check data is 7:1. A dotted square indicates a basic unit within the physical unit to which the data is written, and a blank square indicates a basic unit that has not yet been written. Each basic unit is, for example, one or more memory cells.

In this example, in order to generate data that can protect data stored in the physical unit PU11 within the word line WL1, the memory control circuit unit 42 has to wait for the data to be written to the physical unit PU21 belonging to the same label number in the next word line WL2 before using the data written to the physical units PU11, PU21 to generate the parity check data PRT1 (the ratio of the size of the data written to physical units PU11 and PU21 to the size of the corresponding parity check data PRT1 is 7:1).

It should be noted that during the process of generating the parity check data, the memory control circuit unit 42 may copy the written data into the buffer memory 65 to accelerate the operation of generating the parity check data. Alternatively, the data to be written is temporarily stored in a buffer 65, parity check data is generated, and then the data to be written along with the parity check data is written to a rewritable non-volatile memory module 43.

That is, if a writing sequence of the conventional approach is used, in the process of generating the parity check data (e.g., generating the parity check data PRT1), the memory control circuit unit 42 will consume additional resources, e.g., it will have to wait for additional time (e.g., the time to wait for the data writing operation of physical units PU12, PU13, and PU14 to be completed) and consume additional space in the buffer memory 65 (e.g., space for recording data to be stored in physical units PU12, PU13, PU14).

Figure 15A:
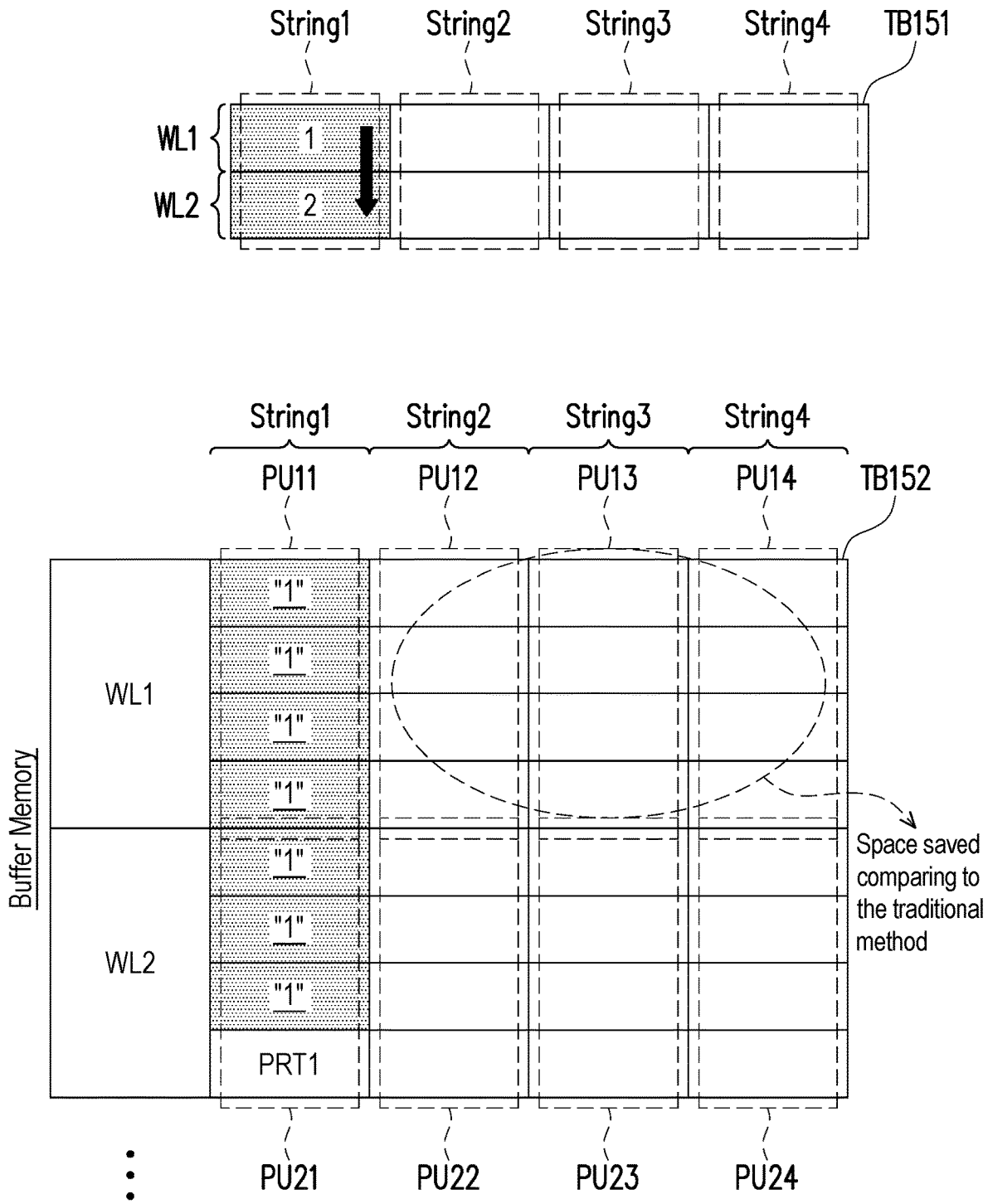
FIG. 15A is a schematic diagram of generating parity check data shown according to an exemplary embodiment of the present invention.

FIG. 15A is a schematic diagram of generating parity check data shown according to an exemplary embodiment of the present invention.

Referring to FIG. 15A, unlike the example of FIG. 14, the data writing method in FIG. 15A utilizes a first pattern writing sequence as shown in table TB151 (see FIG. 11).

In this example, in order to generate data that can protect data (the label number of this stored data is "1") stored in the physical unit PU11 within the word line WL1, the memory control circuit unit 42 may generate parity check data PRT1 directly based on the data in the physical unit PU11 and the data written to the physical unit PU21 (belonging to the same label number "1") in the next word line WL2 (The ratio of the size of the data written to physical units PU11 and PU21 to the size of the corresponding parity check data PRT1 is 7:1).

That is, if the first pattern writing sequence provided in the present invention is used, the memory control circuit unit 42 does not consume additional resources in the process (see table TB152) of generating parity check data (e.g., generating the parity check data PRT1). For example, the memory control circuit unit 42 does not need to wait additional time (because there is no need to wait for the data writing operation for the physical units PU12, PU13, PU14) and does not need to consume additional space of the buffer memory 65 (because there is no need for the buffer memory 65 to record data to be stored in the physical units PU12, PU13, PU14). In this way, the overall work efficiency of the memory control circuit unit 42 or the memory storage device 10 is increased. In this example, the space saved is 12/20 (i.e., 3/5) of the using space corresponding to the conventional way.

It is worth noting that the above-described benefits of writing data via the data writing method provided by the present invention increase as the number of string sets per word line increases, and the benefits of the provided writing method are also increase as the data amount ratio used to generate the parity check data increases.

Figure 16:
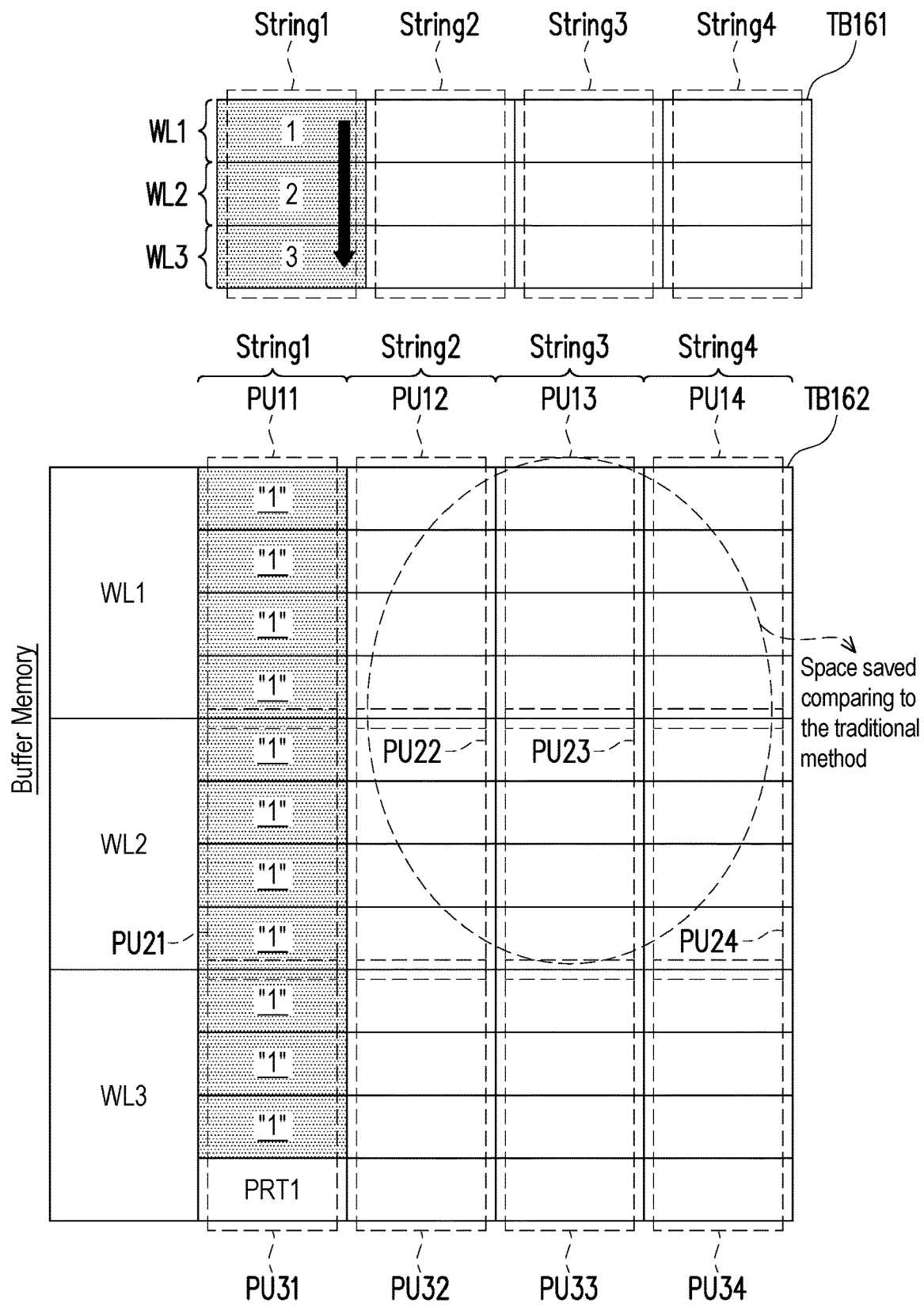
FIG. 16 is a schematic diagram of generating parity check data shown according to another exemplary embodiment of the present invention.

FIG. 16 is a schematic diagram of generating parity check data shown according to another exemplary embodiment of the present invention.

Referring to FIG. 16, as shown in table TB161, the data writing method in FIG. 16 utilizes a first pattern writing sequence (see FIG. 11). Unlike the example in FIG. 15A, the data amount ration used to generate the parity check data is 11:1.

In this example, in order to generate parity check data that can protect data (the label number of this stored data is "1") stored in the physical unit PU11 within the word line WL1, the memory control circuit unit 42 may generate parity check data PRT1 directly based on the data in the physical unit PU11 and the data written to the physical units PU21 and PU31 (belonging to the same label number "1") in the word lines WL2 and WL3 (The ratio of the size of the data written to physical units PU11, PU21 and PU31 to the size of the corresponding parity check data PRT1 is 11:1).

However, if a conventional data writing sequence is used in this example, the parity check data PRT1 for data corresponding to label number "1" is not generated until the data is written to the physical unit PU31. That is, in the process of generating parity check data (e.g., generating the parity check data PRT1) through the conventional way, compared to the example in FIG. 16 above, the memory control circuit unit 42 would consume more additional resources, such as more additional time to wait (e.g., time to wait for the data write operation of the physical unit PU12, PU13, PU14, PU22, PU23, PU24 to be completed), and would consume more additional space of the buffer memory (e.g., space for recording data to be stored in physical units PU12, PU13, PU14, PU22, PU23, PU24). In the example corresponding to FIG. 16, as shown in table TB162, the space saved is 24/36 (i.e., 2/3) of the suing space corresponding to the conventional way.

Similarly, in another example, it is assumed that the total number of string sets per word line is more, e.g., eight. In the process of generating parity check data through conventional method, compared to the data writing method provided by the present invention, the memory control circuit unit 42 will inevitably consume more additional resources, e.g., it will need to wait more additional time (because it will need to wait for more physical units for the data write operation to be completed) and need to consume more additional space of the buffer memory (because of the additional space needed to record data to be stored in other physical units corresponding to different label numbers).

In summary, exemplary embodiments of the present invention may use the provided data writing sequences of different pattern to write multiple physical units corresponding to the same string set respectively in a plurality of word lines in the direction of the arrangement of the plurality of word lines, so as to save system resources in the process of generating parity check data. Such that, the efficiency of the memory storage device 10 and the memory control circuit 42 are improved. At the same time, it can also avoid the problem of write interference caused by write sequence different to the conventional way or avoid the problem of data loss caused by the failure caused during writing data.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A data writing method, adapted for a rewritable non-volatile memory module, wherein the rewritable non-volatile memory module comprises a plurality of word lines and a plurality of bit lines intersecting the plurality of word lines, wherein the intersection of the word lines and the bit lines forms a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets, the method comprising:
- obtaining a write command, wherein the write command is configured to instruct to write a write data into the rewritable non-volatile memory module;
- writing, according to the write command, a first data in the write data into a target physical unit of a target word line among the P word lines;
- selecting, after writing the first data, one or more further target physical units that are respectively located within one or more further target word lines while one or more blank physical units, available to be written, are within the target word line and arranged sequentially after the target physical unit according to the order of the M string sets; and
- writing a second data, subsequent to the first data, of the write data into the selected one or more further target physical units.

2. The data writing method according to claim 1, wherein writing, according to the write command, the first data in the write data into the target physical unit of the target word line among the P word lines comprises:
- writing the first data into $j^{th}$ physical unit corresponding to $j^{th}$ string set within $i^{th}$ word line, wherein the $i^{th}$ word line is the target word line, and the $j^{th}$ physical unit is the target physical unit,
- wherein the steps of writing the second data into the one or more further target physical units respectively located within the one or more further target word lines comprises:
- writing the second data into the $j^{th}$ physical unit corresponding to the $j^{th}$ string set within i+1th word line, wherein the i+1th word line is the further target word line, and the $j^{th}$ physical unit within the i+1th word line is the further target physical unit.

3. The data writing method according to claim 2, after writing the second data, the method further comprises:
- writing a third data, subsequent to the second data, of the write data into a j+1th physical unit corresponds to a j+1th string set in the $i^{th}$ word line, wherein $j^{th}$ physical unit corresponding to the $j^{th}$ string set in the i+2th word line is blank; and
- writing a fourth data, subsequent to the third data, of the write data into a j+1th physical unit corresponds to a $j+1^{th}$ string set in the $i+1^{th}$ word line, wherein $j^{th}$ physical unit corresponding to the $j^{th}$ string set in the $i+2^{th}$ word line is blank.

4. The data writing method according to claim 2, after writing the second data, the method further comprises:
- before writing the third data, subsequent to the second data, of the write data, determining whether a blank $j^{th}$ physical unit, corresponding to the $j^{th}$ string set, located in the $i+2^{th}$ word line is existed;
- in response to determining that the blank $j^{th}$ physical unit, corresponding to the $j^{th}$ string set, located in the $i+2^{th}$ word line is existed, writing the third data into the blank $j^{th}$ physical unit, corresponding to the $j^{th}$ string set, in the $i+2^{th}$ word line; and
- in response to determining that the blank $j^{th}$ physical unit, corresponding to the $j^{th}$ string set, located in the $i+2^{th}$ word line is not existed, writing the third data into a $j+1^{th}$ physical unit, corresponding to a $j+1^{th}$ string set, in the $i^{th}$ word line.

5. The data writing method according to claim 1, wherein the plurality of word lines and the plurality of bit lines intersecting the word lines form a three-dimensional structure, wherein the plurality of bit lines are grouped into the M string sets sequentially arranged along a first direction, N bit lines of each string set are arranged sequentially along a second direction and are extended along a third direction, wherein the P word lines corresponding to the same string set are sequentially arranged along the third direction and are extended along the second direction, wherein the P word lines are arranged along the third direction, wherein the N bit lines of each string set meet into the respective P segments in the P word lines corresponding to the same string set to form the M×N memory cells in each word line, so as to form M physical units, corresponding to the M string sets, arranged along the first direction in each word line, wherein the first direction, the second direction, and the third direction are perpendicular to each other.

6. The data writing method according to claim 5, wherein the step of writing the first data in the write data into the target physical unit of the target word line among the P word lines and the step of writing the second data into the one or more further target physical units respectively located in the one or more further target word lines comprises:
- writing the first data and the second data into a plurality of first physical units, corresponding to a $j^{th}$ string set, respectively located in a plurality of first word lines arranged along the third direction.

7. The data writing method according to claim 6, wherein a total number of the plurality of first physical units is determined based on a data amount ratio required to generate the parity check data, the method further comprising:
- generating parity check data corresponding to the first data and the second data based on written the first data and the second data,
- wherein the ratio between the size of that first data and that second data and the size of the generated parity check data is the data amount ratio, and the plurality of first physical units having the total number are used for storing the first data and the second data.

8. The data writing method according to claim 6, after writing the second data, the method further comprises:
- writing the third data, subsequent to the second data, of the write data into a plurality of second physical units, correspond to $j+1^{th}$ string set, respectively located in the plurality of first word lines arranged along the third direction, wherein a third physical unit arranged, along the third direction, after the plurality of first physical units is blank.

9. The data writing method according to claim 6, after writing the second data, the method further comprises:
- before writing the third data, subsequent to the second data, of the write data, determining whether there exist blank one or more third physical units, corresponding to the $j^{th}$ string set, arranged, along the third direction, after the plurality of first physical units;
- in response to determining that there exist the blank one or more third physical units, corresponding to the $j^{th}$ string set, arranged, along the third direction, after the plurality of first physical units, writing the third data into the blank one or more third physical units, wherein the blank one or more third physical units are respectively located at one or more second word lines arranged, along the third direction, after the plurality of first word lines; and
- in response to determining that there does not exist the blank one or more third physical units, corresponding to the $j^{th}$ string set, arranged, along the third direction, after the plurality of first physical units, writing the third data into a plurality of second physical units, corresponding to a j+1$^{th}$ string set, respectively located in the plurality of first word lines arranged along the third direction.

10. The data writing method according to claim 9, the method further comprises:
in response to determining that there does not exist the blank one or more third physical units, corresponding to the j$^{th}$ string set, arranged, along the third direction, after the plurality of first physical units, before writing the third data into the plurality of second physical units corresponding to the j+1$^{th}$ string set, backing up data stored in all physical units, corresponding to the j$^{th}$ string set, in the P word lines and parity check data corresponding to the data; and
after backing up the data corresponding to the j$^{th}$ string set and the parity check data corresponding to the data, writing the third data into the plurality of second physical units, corresponding to the j+1$^{th}$ string set, respectively located in the plurality of first word lines arranged along the third direction.

11. A data writing method, adapted for a rewritable non-volatile memory, wherein the rewritable non-volatile memory module comprises a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the MXN memory cells of each word line form M physical units corresponding to M string sets, the method comprising:
generating and transmitting, by a memory management circuit, a first write command sequence to instruct to write a first write data into a target physical erase unit of the plurality of physical erase units;
generating and transmitting, by the memory management circuit, a second write command sequence to instruct to write a second write data into the target physical erase unit;
writing, by a memory interface, the first write data into a first physical address in the target physical erase unit according to the first write command sequence; and
writing, by the memory interface, the second write data into a second physical address in the target physical erase unit according to the second write command sequence,
wherein the first word line to which the first physical address belongs is different from the second word line to which the second physical address belongs,
wherein when the second write data is written into the second physical address within that target physical erase unit, blank one or more physical addresses are arranged after the first physical address within the first word line,
wherein, during a time interval between execution of the first write command sequence and the execution of the second write command sequence, no write command sequence for instructing to write data into the target physical erase unit is executed.

12. The data writing method according to claim 11, wherein the memory management circuit records a physical address list, wherein data of a plurality of fields of the physical address list comprises: a plurality of physical address numbers corresponding to a plurality of physical addresses, a plurality of word line identifiers respectively corresponding to the plurality of physical address numbers, and a plurality of string set identifiers respectively corresponding to the plurality of physical address numbers, and the method further comprises:
generating, by the memory management circuit, the first write command sequence according to a first physical address number among the physical address numbers to instruct to write the first write data into the first physical address corresponding to the first physical address number, wherein the first physical address is a first physical unit, corresponding to the first physical address number, of a first string set in a first word line;
generating, by the memory management circuit, the second write command sequence according to a second physical address number among the physical address numbers to instruct to write the second write data into the second physical address corresponding to the second physical address number, wherein the second physical address is a second physical unit, corresponding to the second physical address number, of a second string set in a second word line,
wherein the first physical address number and the second physical address number are not two consecutive physical address numbers in the physical address list.

13. The data writing method according to claim 12, wherein the physical addresses corresponding to the physical address numbers in the physical address list are grouped into a plurality of groups of physical addresses according to order of the word line identifiers, wherein a plurality of physical addresses in each group of physical addresses are arranged according to order of corresponding string sets, wherein the physical address numbers are arranged in ascending order.

14. A memory storage device, comprising:
A connection interface unit, configured to couple to a host system;
a rewritable non-volatile memory module, comprising a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets; and
a memory control circuit unit, coupled to the connection interface unit and the rewritable nonvolatile memory module, wherein the memory control circuit unit is configured to:
obtain a write command, wherein the write command is configured to instruct to write a write data into the rewritable non-volatile memory module;
write, according to the write command, a first data in the write data into a target physical unit of a target word line among the P word lines;
select, after writing the first data, one or more further target physical units that are respectively located within one or more further target word lines while one or more blank physical units, available to be written, are within the target word line and arranged sequentially after the target physical unit according to the order of the M string sets; and write a second data, subsequent to the first data, of the write data into the selected one or more further target physical units.

15. The memory storage device according to claim 14, wherein writing, according to the write command, the first data in the write data into the target physical unit of the target word line among the P word lines comprises:

writing the first data into $j^{th}$ physical unit corresponding to $j^{th}$ string set within $i^{th}$ word line, wherein the $i^{th}$ word line is the target word line, and the $j^{th}$ physical unit is the target physical unit, wherein the steps of writing the second data into the one or more further target physical units respectively located within the one or more further target word lines comprises:

writing the second data into the $j^{th}$ physical unit corresponding to the $j^{th}$ string set within $i+1^{th}$ word line, wherein the $i+1^{th}$ word line is the further target word line, and the $j^{th}$ physical unit within the $i+1^{th}$ word line is the further target physical unit.

16. The memory storage device according to claim 15, after writing the second data, the memory control circuit unit is further configured to:

write a third data, subsequent to the second data, of the write data into a $j+1^{th}$ physical unit corresponds to a $j+1^{th}$ string set in the $i^{th}$ word line, wherein $j^{th}$ physical unit corresponding to the $j^{th}$ string set in the $i+2^{th}$ word line is blank; and write a fourth data, subsequent to the third data, of the write data into a $j+1^{th}$ physical unit corresponds to a $j+1^{th}$ string set in the $i+1^{th}$ word line, wherein $j^{th}$ physical unit corresponding to the $j^{th}$ string set in the $i+2^{th}$ word line is blank.

17. The memory storage device according to claim 15, after writing the second data, the memory control circuit unit is further configured to:

before writing the third data, subsequent to the second data, of the write data, determine whether a blank $j^{th}$ physical unit, corresponding to the $j^{th}$ string set, located in the $i+2^{th}$ word line is existed;

in response to determining that the blank $j^{th}$ physical unit, corresponding to the $j^{th}$ string set, located in the $i+2^{th}$ word line is existed, write the third data into the blank $j^{th}$ physical unit, corresponding to the $j^{th}$ string set, in the $i+2^{th}$ word line; and in response to determining that the blank $j^{th}$ physical unit, corresponding to the $j^{th}$ string set, located in the $i+2^{th}$ word line is not existed, write the third data into a $j+1^{th}$ physical unit, corresponding to a $j+1^{th}$ string set, in the $i^{th}$ word line.

18. The memory storage device according to claim 14, wherein the plurality of word lines and the plurality of bit lines intersecting the word lines form a three-dimensional structure, wherein the plurality of bit lines are grouped into the M string sets sequentially arranged along a first direction, N bit lines of each string set are arranged sequentially along a second direction and are extended along a third direction, wherein the P word lines corresponding to the same string set are sequentially arranged along the third direction and are extended along the second direction, wherein the P word lines are arranged along the third direction, wherein the N bit lines of each string set meet into the respective P segments in the P word lines corresponding to the same string set to form the M×N memory cells in each word line, so as to form M physical units, corresponding to the M string sets, arranged along the first direction in each word line, wherein the first direction, the second direction, and the third direction are perpendicular to each other.

19. The memory storage device according to claim 18, wherein the step of writing the first data in the write data into the target physical unit of the target word line among the P word lines and the step of writing the second data into the one or more further target physical units respectively located in the one or more further target word lines comprises:

writing the first data and the second data into a plurality of first physical units, corresponding to a $j^{th}$ string set, respectively located in a plurality of first word lines arranged along the third direction.

20. The memory storage device according to claim 19, wherein a total number of the plurality of first physical units is determined based on a data amount ratio required to generate the parity check data, and the memory control circuit unit is further configured to:

generate parity check data corresponding to the first data and the second data based on written the first data and the second data, wherein the ratio between the size of that first data and that second data and the size of the generated parity check data is the data amount ratio, and the plurality of first physical units having the total number are used for storing the first data and the second data.

21. The memory storage device according to claim 19, after writing the second data, the memory control circuit unit is further configured to:

write the third data, subsequent to the second data, of the write data into a plurality of second physical units, correspond to $j+1^{th}$ string set, respectively located in the plurality of first word lines arranged along the third direction, wherein a third physical unit arranged, along the third direction, after the plurality of first physical units is blank.

22. The memory storage device according to claim 19, after writing the second data, the memory control circuit unit is further configured to:

before writing the third data, subsequent to the second data, of the write data, determine whether there exist blank one or more third physical units, corresponding to the $j^{th}$ string set, arranged, along the third direction, after the plurality of first physical units;

in response to determining that there exist the blank one or more third physical units, corresponding to the $j^{th}$ string set, arranged, along the third direction, after the plurality of first physical units, write the third data into the blank one or more third physical units, wherein the blank one or more third physical units are respectively located at one or more second word lines arranged, along the third direction, after the plurality of first word lines; and in response to determining that there does not exist the blank one or more third physical units, corresponding to the $j^{th}$ string set, arranged, along the third direction, after the plurality of first physical units, write the third data into a plurality of second physical units, corresponding to a $j+1^{th}$ string set, respectively located in the plurality of first word lines arranged along the third direction.

23. The memory storage device according to claim 22, wherein the memory control circuit unit is further configured to:

in response to determining that there does not exist the blank one or more third physical units, corresponding to the $j^{th}$ string set, arranged, along the third direction, after the plurality of first physical units, before writing the third data into the plurality of second physical units corresponding to the $j+1^{th}$ string set, back up data stored in all physical units, corresponding to the $j^{th}$ string set, in the P word lines and parity check data corresponding to the data; and after backing up the data corresponding to the $j^{th}$ string set and the parity check data corresponding to the data, write the third data into the plurality of second physical units, corresponding to the $j+1^{th}$ string set, respectively located in the plurality of first word lines arranged along the third direction.

24. A memory storage device, comprising:

a connection interface unit, configured to couple to a host system;

a rewritable non-volatile memory module, comprising a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the MXN memory cells of each word line form M physical units corresponding to M string sets; and a memory control circuit unit, coupled to the connection interface unit and the rewritable nonvolatile memory module, wherein a memory management circuit of the memory control circuit unit is configured to generate and transmit a first write command sequence to instruct to write a first write data into a target physical erase unit of the plurality of physical erase units, wherein the memory management circuit is further configured to generate and transmit a second write command sequence to instruct to write a second write data into the target physical erase unit, wherein a memory interface of the memory control circuit unit is configured to write the first write data into a first physical address in the target physical erase unit according to the first write command sequence, wherein the memory interface is further configured to write the second write data into a second physical address in the target physical erase unit according to the second write command sequence, wherein the first word line to which the first physical address belongs is different from the second word line to which the second physical address belongs, wherein when the second write data is written into the second physical address within that target physical erase unit, blank one or more physical addresses are arranged after the first physical address within the first word line, wherein, during a time interval between execution of the first write command sequence and the execution of the second write command sequence, no write command sequence for instructing to write data into the target physical erase unit is executed.

25. The memory storage device according to claim 24, wherein the memory management circuit records a physical address list, wherein data of a plurality of fields of the physical address list comprises: a plurality of physical address numbers corresponding to a plurality of physical addresses, a plurality of word line identifiers respectively corresponding to the plurality of physical address numbers, and a plurality of string set identifiers respectively corresponding to the plurality of physical address numbers, wherein the memory management circuit generates the first write command sequence according to a first physical address number among the physical address numbers to instruct to write the first write data into the first physical address corresponding to the first physical address number, wherein the first physical address is a first physical unit, corresponding to the first physical address number, of a first string set in a first word line, wherein the memory management circuit generates the second write command sequence according to a second physical address number among the physical address numbers to instruct to write the second write data into the second physical address corresponding to the second physical address number, wherein the second physical address is a second physical unit, corresponding to the second physical address number, of a second string set in a second word line, wherein the first physical address number and the second physical address number are not two consecutive physical address numbers in the physical address list.

26. The memory storage device according to claim 25, wherein the physical addresses corresponding to the physical address numbers in the physical address list are grouped into a plurality of groups of physical addresses according to order of the word line identifiers, wherein a plurality of physical addresses in each group of physical addresses are arranged according to order of corresponding string sets, wherein the physical address numbers are arranged in ascending order.

27. A memory control circuit unit, comprising:

a host interface, configured to couple to a host system;

a memory interface, configured to couple to a rewritable non-volatile memory module, wherein the rewritable non-volatile memory module comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the MXN memory cells of each word line form M physical units corresponding to M string sets; and a memory management circuit, coupled to the host interface and the memory interface, wherein the memory management circuit is configured to:

obtain a write command, wherein the write command is configured to instruct to write a write data into the rewritable non-volatile memory module;

write, according to the write command, a first data in the write data into a target physical unit of a target word line among the P word lines;

select, after writing the first data, one or more further target physical units that are respectively located within one or more further target word lines while one or more blank physical units, available to be written, are within the target word line and arranged sequentially after the target physical unit according to the order of the M string sets; and write a second data, subsequent to the first data, of the write data into the selected one or more further target physical units.

28. The memory control circuit unit according to claim 27, wherein writing, according to the write command, the first data in the write data into the target physical unit of the target word line among the P word lines comprises:

writing the first data into $j^{th}$ physical unit corresponding to $j^{th}$ string set within $i^{th}$ word line, wherein the $i^{th}$ word line is the target word line, and the $j^{th}$ physical unit is the target physical unit, wherein the steps of writing the second data into the one or more further target physical units respectively located within the one or more further target word lines comprises:

writing the second data into the $j^{th}$ physical unit corresponding to the $j^{th}$ string set within $i+1^{th}$ word line, wherein the $i+1^{th}$ word line is the further target word line, and the $j^{th}$ physical unit within the $i+1^{th}$ word line is the further target physical unit.

29. The memory control circuit unit according to claim 28, after writing the second data, the memory management circuit is further configured to:

write a third data, subsequent to the second data, of the write data into a $j+1^{th}$ physical unit corresponds to a $j+1^{th}$ string set in the $i^{th}$ word line, wherein $j^{th}$ physical unit corresponding to the $j^{th}$ string set in the $i+2^{th}$ word line is blank; and write a fourth data, subsequent to the third data, of the write data into a $j+1^{th}$ physical unit corresponds to a $j+1^{th}$ string set in the $i+1^{th}$ word line, wherein $j^{th}$ physical unit corresponding to the $j^{th}$ string set in the $i+2^{th}$ word line is blank.

30. The memory control circuit unit according to claim 28, after writing the second data, in which the memory management circuit is further configured:

before writing the third data, subsequent to the second data, of the write data, determine whether a blank $j^{th}$ physical unit, corresponding to the $j^{th}$ string set, located in the $i+2^{th}$ word line is existed;

in response to determining that the blank $j^{th}$ physical unit, corresponding to the $j^{th}$ string set, located in the $i+2^{th}$ word line is existed, write the third data into the blank $j^{th}$ physical unit, corresponding to the $j^{th}$ string set, in the $i+2^{th}$ word line; and in response to determining that the blank $j^{th}$ physical unit, corresponding to the $j^{th}$ string set, located in the $i+2^{th}$ word line is not existed, write the third data into a $j+1^{th}$ physical unit, corresponding to a $j+1^{th}$ string set, in the $i^{th}$ word line.

31. The memory control circuit unit according to claim 27, wherein the plurality of word lines and the plurality of bit lines intersecting the word lines form a three-dimensional structure, wherein the plurality of bit lines are grouped into the M string sets sequentially arranged along a first direction, N bit lines of each string set are arranged sequentially along a second direction and are extended along a third direction, wherein the P word lines corresponding to the same string set are sequentially arranged along the third direction and are extended along the second direction, wherein the P word lines are arranged along the third direction, wherein the N bit lines of each string set meet into the respective P segments in the P word lines corresponding to the same string set to form the M×N memory cells in each word line, so as to form M physical units, corresponding to the M string sets, arranged along the first direction in each word line, wherein the first direction, the second direction, and the third direction are perpendicular to each other.

32. The memory control circuit unit according to claim 31, wherein the step of writing the first data in the write data into the target physical unit of the target word line among the P word lines and the step of writing the second data into the one or more further target physical units respectively located in the one or more further target word lines comprises:

writing the first data and the second data into a plurality of first physical units, corresponding to a $j^{th}$ string set, respectively located in a plurality of first word lines arranged along the third direction.

33. The memory control circuit unit according to claim 32, wherein a total number of the plurality of first physical units is determined based on a data amount ratio required to generate the parity check data, and the memory management circuit is further configured to:

generate parity check data corresponding to the first data and the second data based on written the first data and the second data, wherein the ratio between the size of that first data and that second data and the size of the generated parity check data is the data amount ratio, and the plurality of first physical units having the total number are used for storing the first data and the second data.

34. The memory control circuit unit according to claim 32, after writing the second data, the memory management circuit is further configured to:

write the third data, subsequent to the second data, of the write data into a plurality of second physical units, correspond to $j+1^{th}$ string set, respectively located in the plurality of first word lines arranged along the third direction, wherein a third physical unit arranged, along the third direction, after the plurality of first physical units is blank.

35. The memory control circuit unit according to claim 32, after writing the second data, the memory management circuit is further configured to:

before writing the third data, subsequent to the second data, of the write data, determine whether there exist blank one or more third physical units, corresponding to the $j^{th}$ string set, arranged, along the third direction, after the plurality of first physical units;

in response to determining that there exist the blank one or more third physical units, corresponding to the $j^{th}$ string set, arranged, along the third direction, after the plurality of first physical units, write the third data into the blank one or more third physical units, wherein the blank one or more third physical units are respectively located at one or more second word lines arranged, along the third direction, after the plurality of first word lines; and in response to determining that there does not exist the blank one or more third physical units, corresponding to the $j^{th}$ string set, arranged, along the third direction, after the plurality of first physical units, write the third data into a plurality of second physical units, corresponding to a $j+1^{th}$ string set, respectively located in the plurality of first word lines arranged along the third direction.

36. The memory control circuit unit according to claim 35, wherein the memory management circuit is further configured to:

in response to determining that there does not exist the blank one or more third physical units, corresponding to the $j^{th}$ string set, arranged, along the third direction, after the plurality of first physical units, before writing the third data into the plurality of second physical units corresponding to the $j+1^{th}$ string set, back up data stored in all physical units, corresponding to the $j^{th}$ string set, in the P word lines and parity check data corresponding to the data; and after backing up the data corresponding to the $j^{th}$ string set and the parity check data corresponding to the data, write the third data into the plurality of second physical units, corresponding to the $j+1^{th}$ string set, respectively located in the plurality of first word lines arranged along the third direction.

37. A memory control circuit unit, comprising:
a host interface, configured to couple to a host system;
a memory interface, configured to couple to a rewritable non-volatile memory module, wherein the rewritable non-volatile memory module comprises a plurality of physical erase units, wherein each physical erase unit comprises a plurality of word lines and a plurality of bit lines intersecting the plurality of word lines, wherein the intersection of the plurality of word lines and the plurality of bit lines constitutes a plurality of memory cells for storing data, wherein the rewritable non-volatile memory module comprises P word lines, each word line comprising M segments corresponding to M string sets, wherein each of the M segments and intersected N bit lines form N memory cells corresponding to a same string set, and the N memory cells form a physical unit such that the M×N memory cells of each word line form M physical units corresponding to M string sets;
a memory management circuit, coupled to the host interface and the memory interface,
wherein the memory management circuit is configured to generate and transmit a first write command sequence to instruct to write a first write data into a target physical erase unit of the plurality of physical erase units,
wherein the memory management circuit is further configured to generate and transmit a second write command sequence to instruct to write a second write data into the target physical erase unit,
wherein the memory interface is configured to write the first write data into a first physical address in the target physical erase unit according to the first write command sequence,
wherein the memory interface is further configured to write the second write data into a second physical address in the target physical erase unit according to the second write command sequence,
wherein the first word line to which the first physical address belongs is different from the second word line to which the second physical address belongs,
wherein when the second write data is written into the second physical address within that target physical erase unit, blank one or more physical addresses are arranged after the first physical address within the first word line,
wherein, during a time interval between execution of the first write command sequence and the execution of the second write command sequence, no write command sequence for instructing to write data into the target physical erase unit is executed.

38. The memory control circuit unit according to claim 37, wherein the memory management circuit records a physical address list, wherein data of a plurality of fields of the physical address list comprises: a plurality of physical address numbers corresponding to a plurality of physical addresses, a plurality of word line identifiers respectively corresponding to the plurality of physical address numbers, and a plurality of string set identifiers respectively corresponding to the plurality of physical address numbers, wherein
the memory management circuit generates the first write command sequence according to a first physical address number among the physical address numbers to instruct to write the first write data into the first physical address corresponding to the first physical address number, wherein the first physical address is a first physical unit, corresponding to the first physical address number, of a first string set in a first word line,
wherein the memory management circuit generates the second write command sequence according to a second physical address number among the physical address numbers to instruct to write the second write data into the second physical address corresponding to the second physical address number, wherein the second physical address is a second physical unit, corresponding to the second physical address number, of a second string set in a second word line,
wherein the first physical address number and the second physical address number are not two consecutive physical address numbers in the physical address list.

39. The memory control circuit unit according to claim 38, wherein the physical addresses corresponding to the physical address numbers in the physical address list are grouped into a plurality of groups of physical addresses according to order of the word line identifiers, wherein a plurality of physical addresses in each group of physical addresses are arranged according to order of corresponding string sets, wherein the physical address numbers are arranged in ascending order.

* * * * *